United States Patent
Yang et al.

(10) Patent No.: US 12,218,015 B2
(45) Date of Patent: Feb. 4, 2025

(54) INTERFEROMETER SYSTEMS AND METHODS FOR REAL TIME ETCH PROCESS COMPENSATION CONTROL

(71) Applicant: Taiwan Semiconductor Manufacturing Company, Ltd., Hsinchu (TW)

(72) Inventors: Chansyun Yang, Hsinchu (TW); Chan-Lon Yang, Taipei (TW); Keh-Jeng Chang, Hsinchu (TW); Perng-Fei Yuh, Walnut Creek, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 625 days.

(21) Appl. No.: 17/397,989

(22) Filed: Aug. 10, 2021

(65) Prior Publication Data
US 2022/0336294 A1    Oct. 20, 2022

Related U.S. Application Data

(60) Provisional application No. 63/176,158, filed on Apr. 16, 2021.

(51) Int. Cl.
| | | |
|---|---|---|
| *H01L 21/67* | (2006.01) | |
| *G03F 7/00* | (2006.01) | |
| *H01L 21/02* | (2006.01) | |
| *H01L 21/66* | (2006.01) | |
| *H01L 21/027* | (2006.01) | |

(52) U.S. Cl.
CPC .......... *H01L 22/20* (2013.01); *G03F 7/70875* (2013.01); *H01L 21/67253* (2013.01); *H01L 22/12* (2013.01); *H01L 22/14* (2013.01); *G03F 7/70625* (2013.01); *H01L 21/0275* (2013.01)

(58) Field of Classification Search
None
See application file for complete search history.

(56) References Cited

U.S. PATENT DOCUMENTS

| | | | | | |
|---|---|---|---|---|---|
| 5,416,594 | A | * | 5/1995 | Gross | G01N 21/9501 356/237.5 |
| 5,450,205 | A | * | 9/1995 | Sawin | G01B 11/0675 216/60 |

(Continued)

OTHER PUBLICATIONS

Gui et al., "On-Chip Silicon Two-Mode (De)Multiplexer for OFDM/OQAM Data Transmission Based on Grating-Assisted Coupler", Dec. 2015, IEEE Photonics Journal, vol. 7, No. 6. (Year: 2015).*

(Continued)

*Primary Examiner* — Mohammad Ali
*Assistant Examiner* — Kelvin Booker
(74) *Attorney, Agent, or Firm* — Kilpatrick Townsend & Stockton LLP

(57) ABSTRACT

An apparatus includes a beam conditioning assembly configured to output one or more wavelengths to a substrate being processed and receive one or more reflected wavelengths from the substrate, and a machine learning device configured to process the one or more reflected wavelengths to predict a process variable and compare the predicted process variable with a measured process variable to obtain a comparison result.

20 Claims, 17 Drawing Sheets

(56) References Cited

U.S. PATENT DOCUMENTS

| | | | | |
|---|---|---|---|---|
| 6,271,047 | B1* | 8/2001 | Ushio | B24B 49/04 |
| | | | | 451/6 |
| 6,413,867 | B1* | 7/2002 | Sarfaty | H01L 22/26 |
| | | | | 438/689 |
| 6,649,075 | B1* | 11/2003 | Buie | H01J 37/32935 |
| | | | | 216/60 |
| 7,049,156 | B2* | 5/2006 | Kueny | G01B 11/0625 |
| | | | | 257/E21.53 |
| 7,859,659 | B2* | 12/2010 | Xu | G01N 21/95607 |
| | | | | 356/73 |
| 2004/0185582 | A1* | 9/2004 | Kueny | G06K 7/0095 |
| | | | | 257/E21.53 |
| 2008/0099434 | A1* | 5/2008 | Chandrachood | G03F 1/80 |
| | | | | 216/60 |
| 2008/0102001 | A1* | 5/2008 | Chandrachood | H01J 37/32963 |
| | | | | 422/129 |
| 2008/0266574 | A1* | 10/2008 | Groot | G01B 9/02057 |
| | | | | 356/511 |
| 2010/0321671 | A1* | 12/2010 | Marx | G01B 11/22 |
| | | | | 702/172 |
| 2011/0292375 | A1* | 12/2011 | Marx | G01B 11/0633 |
| | | | | 702/172 |
| 2012/0091587 | A1* | 4/2012 | Or-Bach | H01L 21/845 |
| | | | | 257/E23.145 |
| 2012/0129301 | A1* | 5/2012 | Or-Bach | H10B 10/125 |
| | | | | 438/129 |
| 2013/0241026 | A1* | 9/2013 | Or-Bach | H01L 27/1211 |
| | | | | 257/506 |
| 2013/0267046 | A1* | 10/2013 | Or-Bach | H01L 27/0688 |
| | | | | 257/E21.214 |
| 2019/0154439 | A1* | 5/2019 | Binder | G01S 15/08 |

OTHER PUBLICATIONS

Li et al., "A 2x2 imaging MIMO system based on LED Visible Light Communications employing space balanced coding and integrated Pin array reception", Nov. 2015, Optics Communications 367 (2016 214-218. (Year: 2015).*

Liu et al., "High-Bandwidth in GaN Self-Powered Detector Arrays toward MIMO Visible Light Communication Based on Micro-LED Arrays", Jun. 2019, ACS Photonics 2019, 6, 3186-3195. (Year: 2019).*

Perre et al., "Efficient DSP and Circuit Architectures for Massive MIMO: State of the Art and Future Directions", Jan. 2018, IEEE Transactions on Signal Processing, vol. 66, No. 18, Sep. 15, 2018. (Year: 2018).*

Nguyen et al., "Effects of Ionic Strength in the Medium on Sample Preconcentration Utilizing Nano-interstices between Self-Assembled Monolayers of Gold Nanoparticles", May 2018, BioChip J. (2018) 12(4): 317-325. (Year: 2018).*

* cited by examiner

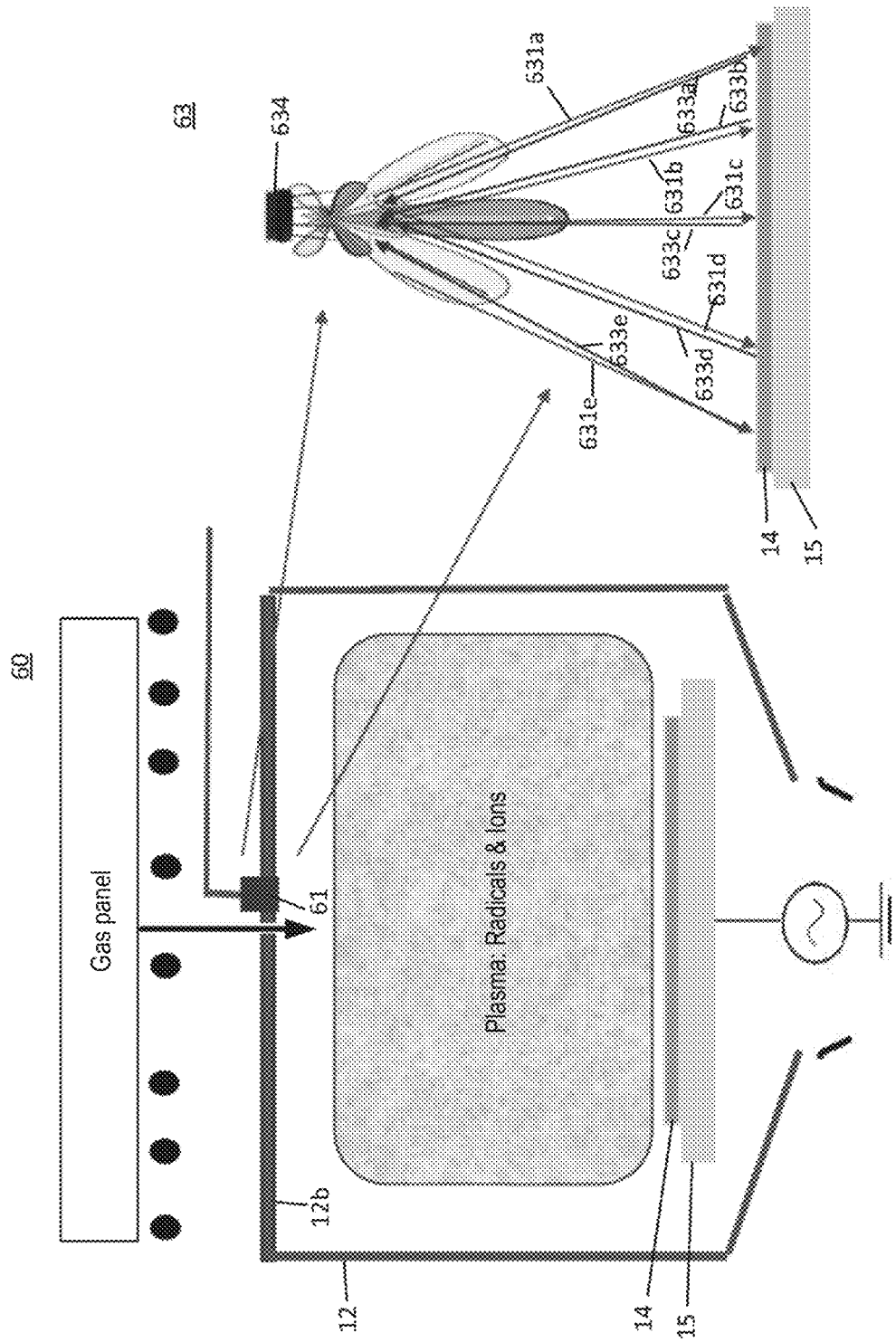

INTERFEROMETER SYSTEMS AND METHODS FOR REAL TIME ETCH PROCESS COMPENSATION CONTROL

CROSS-REFERENCES TO RELATED APPLICATIONS

The present application claims priority to U.S. Provisional Patent Application No. 63/176,158, filed on Apr. 16, 2021, the entire disclosure of which is incorporated herein by reference.

BACKGROUND

Integrated circuits are formed on a semiconductor substrate by sequentially depositing multiple insulating layers and electrically conductive layers on the semiconductor substrate. Etching processes are performed on the insulating layers and electrically conductive layers to form geometric patterns in the layers and through-holes for electrical connections between the layers. Etching processes may include wet etching, in which one or more chemical reagents are utilized to remove materials of the layers, or dry etching, in which a gas is introduced into a reaction chamber, and plasma is generated from the gas, and the plasma reacts with the layer material to form residual products (plasma etching). In the fabrication of integrated circuits, controlling and detecting the etched profiles obtained in the etching processes are very important. Advanced process control (APC) systems are used to perform feedback control to ensure reliable performance of etch processes. The APC systems generally have a delay of 3 to 20 hours for obtaining an outcome of the etch performance. Moreover, due to the time delay and the large amount of data to be monitored, only one to two wafers in a lot of 25 wafers can be monitored for CD (critical dimension) comparison to obtain etch performance results. Monitoring only one or two wafers in a lot of 25 wafers may not catch errors or failure in etch processes.

Controlling and detection an endpoint in an etch process may use a broadband light source to illuminate the substrate and a spectrometer to measure light reflected off the center of a substrate being etched to predict the endpoint. Monitoring the etch rate this way can determine the etch process step time and ensure the uniformity of the etch rate. It also can detect production issues, such as first wafer effect, etch chamber stability, gas line or power abrupt change failure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6A is a simplified schematic block diagram illustrating an interferometer endpoint (IEP) system having one sensor disposed at a center region of a process chamber, where the sensor is a MIMO OFDM device according to an exemplary embodiment.

FIG. 6B is an enlarged schematic view of the MIMO OFDM device according to an embodiment.

DETAILED DESCRIPTION

Figure 1A:
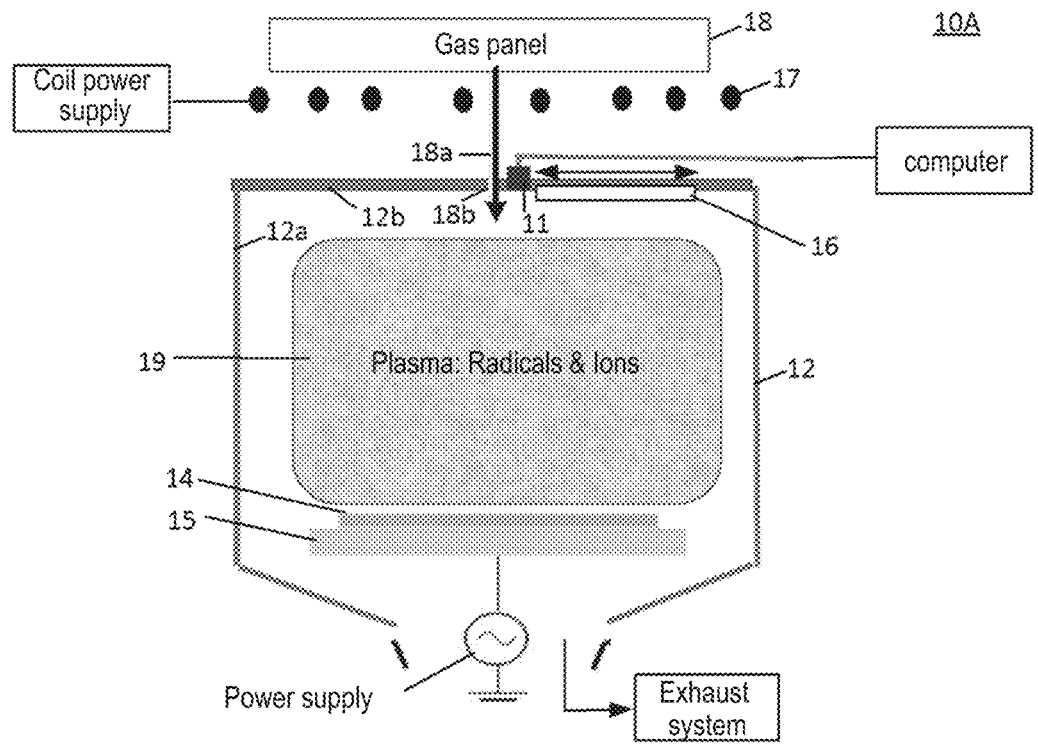
FIG. 1A is a simplified schematic block diagram illustrating an interferometer endpoint (IEP) system having one sensor disposed at a center region of a process chamber according to an exemplary embodiment.

The following detailed description provides many different embodiments or examples to facilitate the understanding of devices and method recited in the claims. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

Spatially relative terms, such as "upper", "lower", "vertical", "horizontal", "depth", "height", "width", "top", "bottom", and the like, are used with reference to the orientation of the figures being described. Because components of embodiments of the present disclosure can be positioned in a number of different orientations, the terms are used for purposes of illustration and is not limiting. The use of the terms first, second, etc. do not denote any order, but rather the terms first, second, etc. are used to distinguish one element from another. Furthermore, the use of the terms a, an, and the like does not denote a limitation of quantity, but rather denote the presence of at least one of the referenced items.

Numerous benefits and advantages are achieved by way of the present disclosure over conventional techniques. Existing etching techniques typically cannot ensure good etch rate uniformity within a substrate. Moreover, they typically do not provide an in-situ feedback signal to compensate the etch process for balancing an abnormal APC feed-forward CD wafer condition to achieve a target after-etch-inspection (AEI) CD and etch depth. A motivation for the present disclosure is to address the aforementioned problems and other problems in existing etching techniques by using Interferometer endpoint (IEP) systems. In accordance with the present disclosure, IEP systems are used to monitor etch spectra for etch process stability. IEP sensors generally are located at the process chamber center to catch etch spectra from the center of wafer to determine the etch process step time from IEP curve trace. In various embodiments, IEP systems allow the tracing of wafer-to-wafer etch performance uniformity and detection of production issues, such as first wafer effect, etch chamber stability, gas line, or power abrupt change failure.

Various embodiments provide an apparatus that performs real time etch process adjustment to improve etch rate uniformity. For example, in some embodiments, the apparatus has a beam conditioning assembly that receives reflection of a plurality of wavelengths from a plurality of regions of a substrate, and a device that creates a model of etch depth prediction based on the reflection of the plurality of wavelengths. In those embodiments, the device can modify process parameters in real time so that a predicted etch depth matches a measured etch depth (e.g., endpoint). In those embodiments, when the predicted etch depth matches the measured etch depth, the process can stop; and when the predicted etch depth does not match the measured etch depth, the apparatus determines whether to modify the process globally or locally. These techniques can overcome problems associated with ex-situ measurement processes that do not have a real-time feedback for the detection and compensation of wafer etch process failure. These and other embodiments of the disclosure, along with many of its advantages and features, are described in more detail below.

FIG. 1A is a simplified schematic block diagram illustrating an IEP apparatus 10A having a light source and one sensor disposed at a center region of a process chamber 12 according to an exemplary embodiment. In an embodiment, the process chamber 12 may be used to perform etching and/or other processes of substrates, such as semiconductor wafers. Example etch processes include chemical etch, plasma etch, reactive ion etch, and cleaning processes. A substrate (wafer) 14 may be arranged on a wafer holding device 15, such as a pedestal or an electrostatic chuck (ESC) arranged in the process chamber 12. An exemplary plasma etch process includes introducing a gas mixture containing one or more precursors into the process chamber, where plasma (radicals and ions) is generated from the gas mixture, and the plasma is struck to etch the substrate (wafer). The terms substrate and wafer are used interchangeably in this disclosure and are understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process may have been utilized to form regions or junctions in the base semiconductor structure or foundation. In addition, semiconductors need not be silicon-based, but could be based on silicon-germanium, germanium, gallium arsenide, or other compound materials.

During an etch process, temperature of the substrate may vary. The temperature variation can have undesirable effects on the processed substrate, such as non-uniformity of the etched substrate, e.g., non-uniform critical dimensions. In some embodiments, the non-uniformity can be eliminated or reduced by spatial control of temperature of the substrate.

Referring to FIG. 1A, the process chamber 12 is a plasma etch chamber including a cylindrical sidewall 12a and a ceiling 12b attached to the sidewall 12a. The ceiling 12b may be dome shaped or flat. An inductive coil 17 is disposed in a vicinity of the ceiling 12b and receives power from a coil power supply to generate an electromagnetic field in the process chamber 12. In an embodiment, the wafer holding device 15 is an electrostatic chuck (ESC) configured to support or secure the substrate 14. Processing gases 18a are introduced into the process chamber 12 from a gas panel 18 through a gas distributor 18b and converted into a plasma in a plasma zone 19 by the electromagnetic field. The plasma zone 19 is defined by the process chamber 12, the cylindrical wall 12a and the ceiling 12b. The wafer holding device 15 is connected to a power supply that generates an electric field to facilitate a vertically oriented anisotropic etching of the substrate 14. Process gases and etchant byproducts are exhausted from the process chamber 12 through an exhaust system disposed in the bottom of the process chamber 12.

In this embodiment, the interferometer endpoint (IEP) apparatus 10A has a light source and a sensor, i.e., an IEP monitor device denoted by 11 that is mounted in a center region of the ceiling 12b. The light source is configured to provide a light beam for illuminating a surface of the substrate 14, and the sensor is configured to measure an intensity of light reflected from the illuminated surface of the substrate. A computing device (denoted "computer") is coupled to the IEP monitor device 11 and configured to calculate in real-time the measured waveform spectra of the reflected light from the surface of the substrate 14 and compare with a predetermined waveform pattern. The light source may provide visible light and/or other wavelengths. In this embodiment, the light beam illuminates approximately the entire surface of the substrate. However, this is not necessarily the only case. In some embodiments, the light beam illuminates a central portion of the surface of the substrate. In this embodiment, the light source and the sensor are mounted on a track 16 above the substrate, and a slider coupled to the light source and sensor 11 moves the light source and sensor 11 linearly back and forth from the center of the substrate to the edge of the substrate along the track 16 to illuminate the entire surface of the substrate, and collect waveform spectra of a reflected light beam from the surface of the substrate.

Figure 1B:
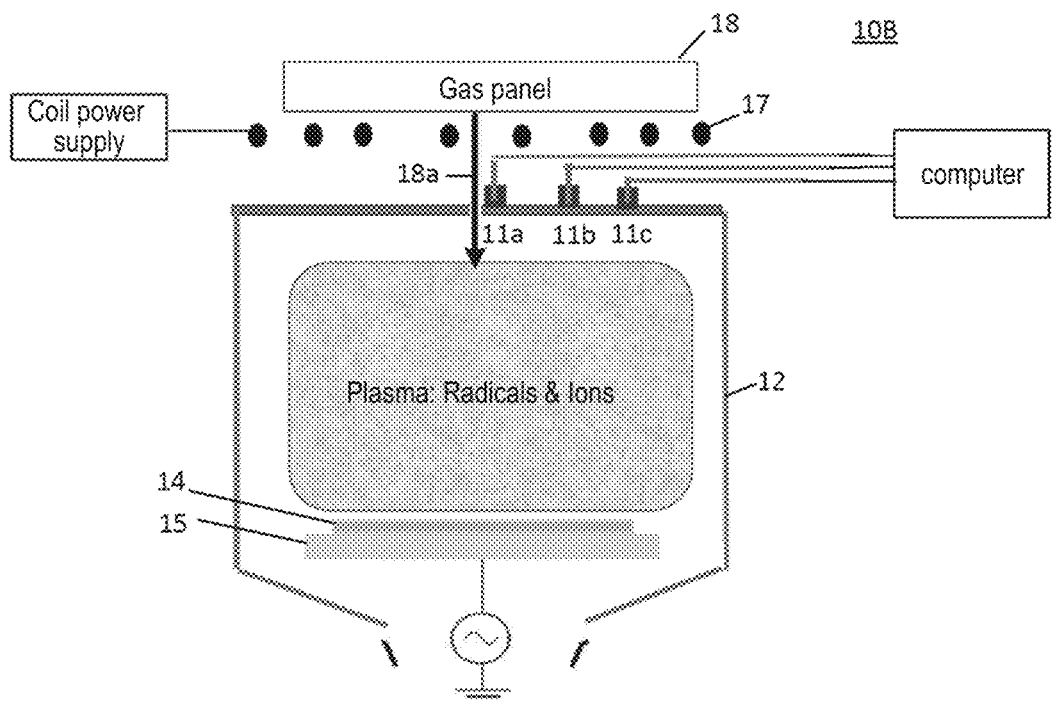
FIG. 1B is a simplified schematic block diagram illustrating an IEP system having three IEP sensors disposed at a center region, a middle region, and an edge region of the process chamber according to an exemplary embodiment.

FIG. 1B is a simplified schematic block diagram illustrating an IEP apparatus 10B having at least one light source and at least one IEP sensor disposed in a process chamber 12 according to an exemplary embodiment. The IEP apparatus 10B is similar to the IEP apparatus 10A with the difference that it has three IEP monitor devices disposed at a center region, a middle region, and an edge region of the process chamber. Accordingly, description in relation to the elements illustrated in FIG. 1A is applicable to the elements in FIG. 1B as appropriate. The IEP apparatus 10B has a first light source and sensor (first IEP monitor device) 11a disposed above a center region, a second light source and sensor (second IEP monitor device) 11b disposed above a middle region, and a third light source and sensor (third IEP monitor device) 11c disposed above an edge region of a substrate 14. The substrate 14 is arranged on a wafer holding device 15, such as a pedestal or an electrostatic chuck (ESC) disposed in the process chamber 12 according to an exemplary embodiment. The first IEP monitor device 11a has a first light source to provide a first light beam illuminating the center region and a first sensor for receiving reflected light from the center region, the second IEP monitor device 11b has a second light source to provide a second light beam illuminating the middle region and a second sensor for receiving reflected light from the middle region, and the third IEP monitor device 11c has a third light source to provide a third light beam illuminating the edge region and a third sensor for receiving reflected light from the edge region. In an embodiment, the first, second, and third light sources each include a visible light source or other wavelengths, and the first, second, and third sensors each include a CCD device. In an embodiment, the first, second, and third light beams can be overlapped on the surface of the substrate 14. In an embodiment, a computer is coupled to the IEP monitor devices and configured to calculate waveform spectra of light reflected from the illuminated surface of the substrate received by the sensors and compare the waveform spectra with predetermined waveform patterns to determine etch depths of processed layers on the substrate.

Figure 2A:
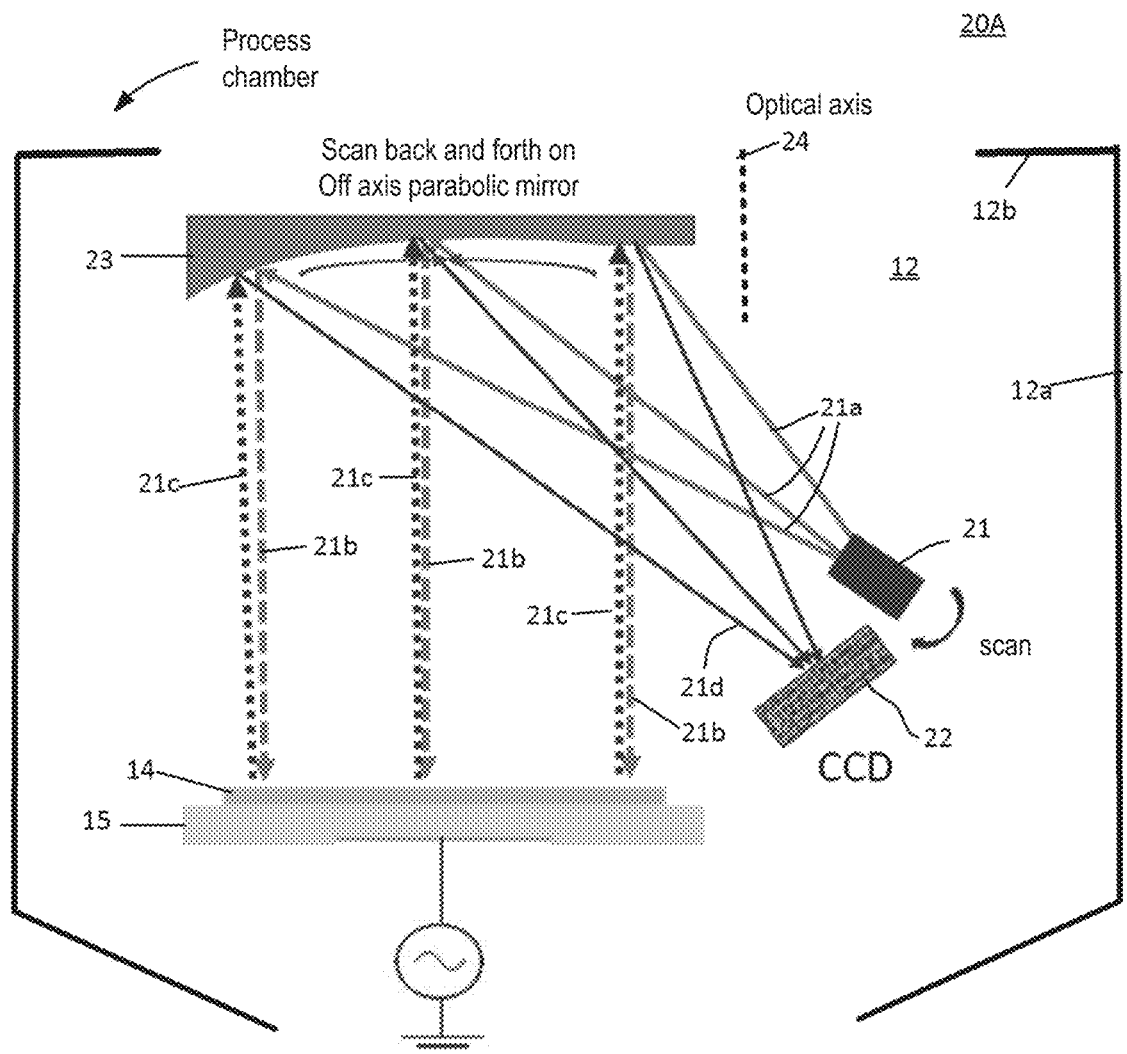
FIG. 2A is a simplified schematic block diagram illustrating a whole wafer etch uniformity IEP control according to an embodiment.

FIG. 2A is a simplified schematic block diagram illustrating a wafer etch uniformity IEP control apparatus 20A according to an embodiment. In the embodiment, instead of illuminating the substrate directly by a light source and receiving light reflected from the illuminated substrate directly by a sensor of the IEP monitor device in the IEP apparatus 10A or 10B, the IEP control apparatus 20A utilizes an off-axis parabolic mirror to collimate light emitted by a light source and direct the collimated light to the substrate. Referring to FIG. 2A, the IEP control apparatus 20A includes a scan device 21, an imaging sensor 22, and an off-axis parabolic mirror 23. The scan device 21, the imaging sensor 22, and the off-axis parabolic mirror 23 are disposed in a process chamber 12. The off-axis parabolic mirror 23 refers to a portion of a parabolic mirror that is off an optical axis 24. In an embodiment, the off-axis parabolic mirror 23 is mounted on the ceiling 12b of the process chamber 12. In an embodiment, the scan device 21 includes a laser source (monochromatic light source), a white light source, a ultra-violet (UV) light source, a near infrared (NIR), an infrared (IR) light source, or combinations thereof, configured to emit a light beam 21a that is steered across a portion surface of the off-axis parabolic mirror 23. In an embodiment, the scan device 21 includes a microelectromechanical mirror that steers a light source provided to the scan device toward a surface of the off-axis parabolic mirror 23. In an embodiment, the scan device 21 includes a multiple input multiple output (MIMO) antenna array that is steerable by a MIMO controller external to the process chamber. The light beam 21a travels to the off-axis parabolic mirror 23 and is reflected as a nearly parallel light beam 21b which falls to a surface of a wafer 14 that is disposed on a wafer holding device 15. The wafer holding device 15 can be a pedestal or an electrostatic chuck (ESC). The nearly parallel beam 21b is parallel to the optical axis 24. Light 21c is a parallel beam reflecting from the surface of the wafer 14, which is perpendicular to the optical axis 24. Light 21c is reflected again from the off-axis parabolic mirror 23 and is converged to the imaging sensor 22 which is located in a vicinity of the scan device 21. The imaging sensor 22 converts the received light 21d into an electrical signal for further processing by a computing device (not shown). In an embodiment, the imaging sensor 22 is a CCD sensor configured to received reflected light pixel-by-pixel, and row-by-row. The use of the off-axis parabolic mirror 23 enables compact system design according to some embodiments. In an embodiment, the off-axis mirror is disposed over the substrate (wafer) 14, the scan device 21 is steerable and configured to scan the entire wafer surface, and the imaging sensor 22 is disposed in the vicinity of the optical axis 24. The wafer etch uniformity IEP control apparatus 20A is embedded in a process chamber similar to the process chamber 12 shown and described with reference to FIG. 1A.

Figure 2B:
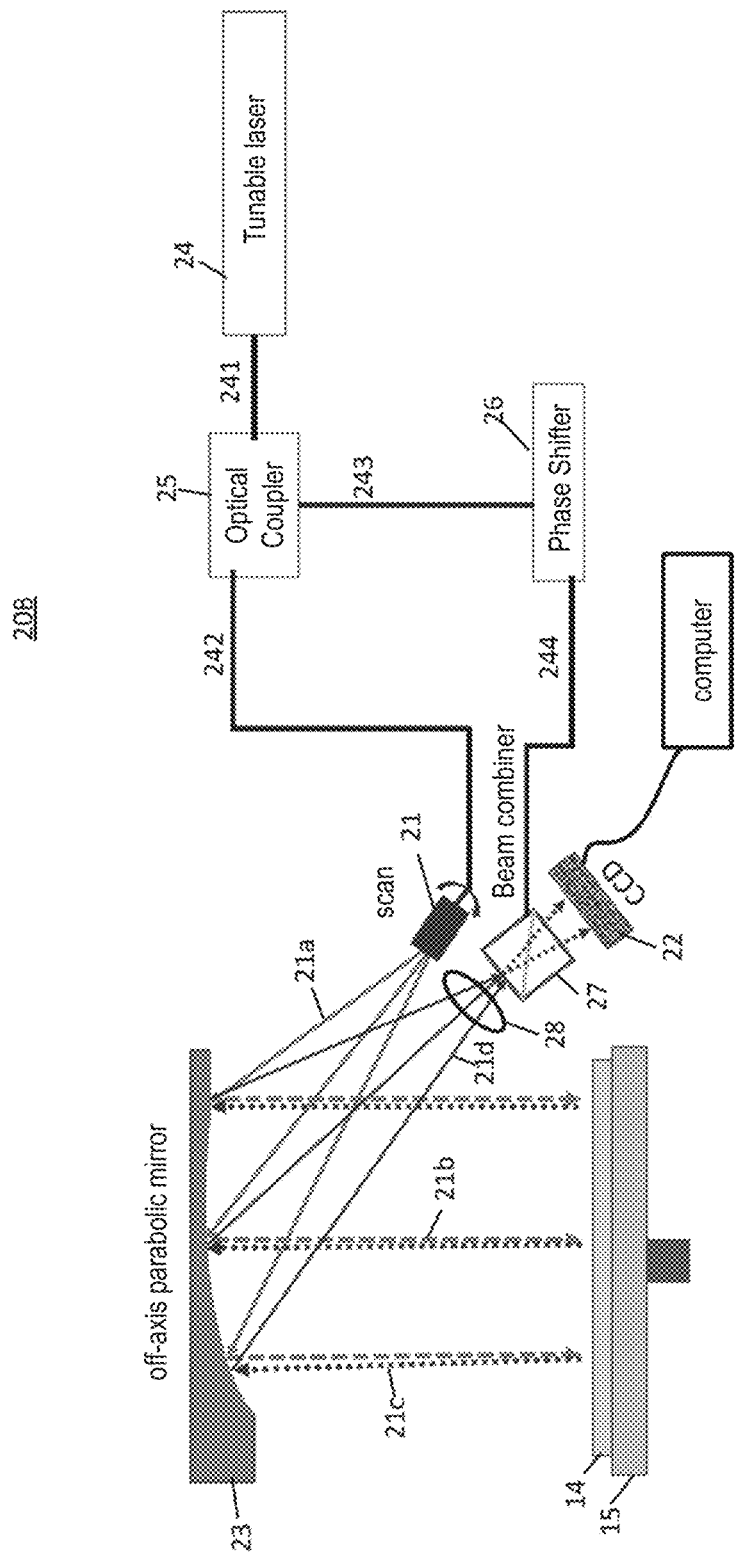
FIG. 2B is a simplified schematic block diagram illustrating a whole wafer etch uniformity IEP control according to an embodiment.

FIG. 2B is a simplified schematic block diagram illustrating a whole wafer etch uniformity IEP control apparatus 20B according to an embodiment. The IEP apparatus 20B is similar to the IEP apparatus 20A with the difference that the IEP apparatus 20B further includes a phase-shifting interferometer configured to measure a surface profile (thickness, flatness) and other geometric properties of a substrate. The phase-shifting interferometer combines a light beam reflected from an illuminated surface of the substrate with a phase-shifted reference light beam to form an optical interference pattern. Spatial variations in the intensity profile of the optical interference pattern can be used to determine the corresponding surface profile of the measured surface of the substrate. Referring to FIG. 2B, the IEP control apparatus 20B includes a scan device 21, an imaging sensor 22, and an off-axis parabolic mirror 23. In an embodiment, the off-axis parabolic mirror 23 is mounted on the ceiling of the process chamber. The scan device 21 is steerable and configured to scan the entire surface of the substrate 14 via the off-axis parabolic mirror 23. The IEP control apparatus 20B also includes a tunable laser device 24, an optical coupler 25, a phase shifter 26, and a beam combiner 27. The tunable laser device 24 is a light source configured to provide a light beam 241 having a first wavelength. In an embodiment, the tunable laser device 24 can be tuned across a plurality of wavelengths. The tuning can be achieved by placing wavelength selective optical elements, such as an etalon, into the laser's optical cavity to provide selection of a particular longitudinal mode of the cavity. When a dispersive element, e.g., a prism, is introduced into the optical cavity, tilting of the cavity's mirrors can cause tuning of the laser as it "hops" between different laser lines. In an exemplary embodiment, the tunable laser is an argon-ion laser, allowing tuning of the laser to a number of spectral lines from ultraviolet and blue through green wavelengths. The optical coupler 25 divides the light beam 241 into a measuring light beam 242 and a reference light beam 243. The measuring light beam 242 is provided to the scan device 21 for illuminating the substrate 14 through the off-axis parabolic mirror 23, and the reference light beam 243 is provided to the phase shifter 26 which shifts the phase of the reference light beam 243 by a predetermined amount with respect to the phase of reflected light 21d from the substrate 14 to obtain a phase-shifted reference light beam 244. The beam combiner 27 combines the reflected light 21d and the phase-shifted reference light beam 244 and provides the combined light beams having different relative phases between the reflected light 21d and the phase-shifted reference light beam 244 to the imaging sensor 22. A computer coupled to the imaging sensor 22 computes and displays phase images of the surface of the processed substrate 14 at different relative phases and holograms. In an embodiment, the IEP control apparatus 20B also includes an optical imaging lens 28 disposed in front of the beam combiner 27 and configured to expand or magnify the angle of the reflected light beam 21d.

Figure 3:
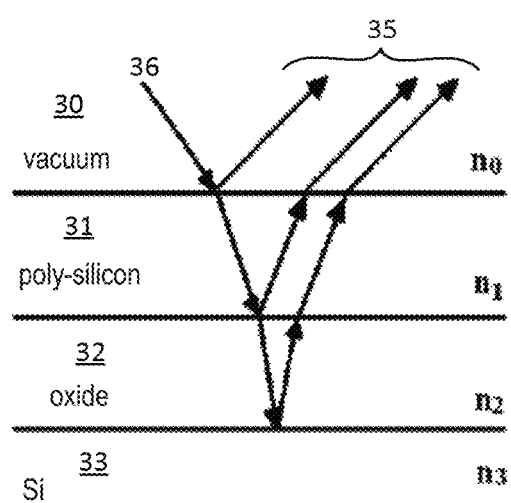
FIG. 3 is a graph illustrating reflectance spectra of an IEP system according to an embodiment.

FIG. 3 is a diagram illustrating reflectance spectra 35 of a light beam 36 provided by an IEP apparatus according to an embodiment. In some exemplary embodiments, the light beam 36 can be a spectral wavelength provided by a light source of the IEP monitor device 11 of the IEP apparatus 10A of FIG. 1A, a light source of one of the IEP monitor devices 11a, 11b, and 11c of the IEP apparatus 10B of FIG. 1B, a light beam 21b of the IEP control apparatus 20A or 20B of respective FIG. 2A or 2B. Referring to FIG. 3, an object having a thickness to be measured includes vacuum 30 (e.g., gas pressure in a vacuum process chamber) having a refractive index n0, a first poly-silicon layer 31 having a refractive index n1, an oxide layer 32 having a refractive index n2, and a silicon layer 33 having a refractive index n3. The oxide layer 32 is on the silicon layer 33, and the poly-silicon layer 31 is on the oxide layer 31. For example, the object can be a measurement surface of the substrate 14 shown in FIGS. 1A, 1B, 2A, and 2B. Depending on the selected wavelength of a light beam 36, reflectance spectra 35 can be obtained. The reflectance spectra 35 contain data such phase differences that facilitate the thickness calculation of the different layers (31, 32). Depending on the materials and thicknesses of the layers, the reflectance spectra 35 of some wavelengths contain more information about the thicknesses of the layers. It is due to the fact that certain wavelengths do not penetrate some materials, and other wavelengths are absorbed by the materials. In some embodiments, an IEP apparatus can automatically select suitable wavelengths depending on the materials and thicknesses of the layers on the measurement surface of the substrate. In some other embodiments, a user can select appropriate spectral wavelengths for measuring the surface properties of the substrate. It will be appreciated that the light beam 36 can be radiated perpendicularly to the measured surface of the substrate, as shown in FIGS. 2A and 2B using an off-axis parabolic mirror.

Figure 4A:
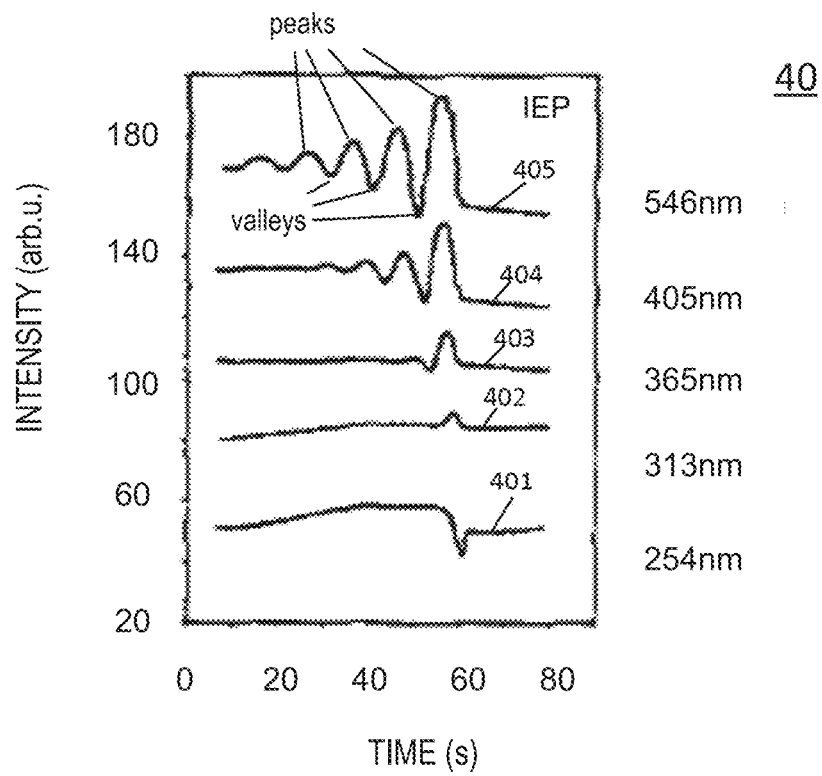
FIG. 4A is a graph illustrating different beams having different wavelengths that illuminate a surface of a wafer according to an embodiment.
Figure 4B:
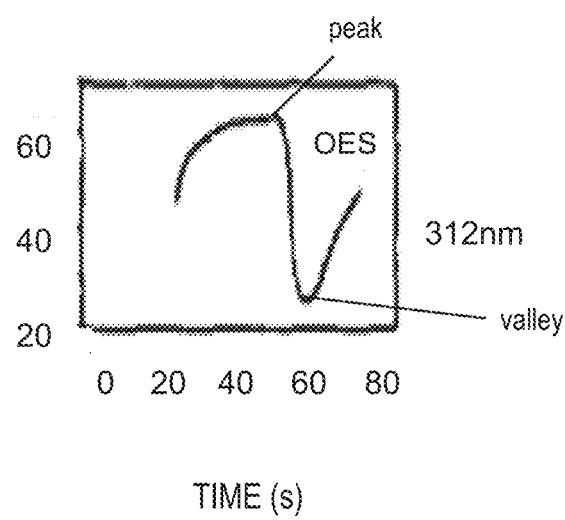
FIG. 4B is an enlarged schematic view of a portion of an optical emission spectrum according to an embodiment.

FIG. 4A and FIG. 4B illustrate an enabling principle for various embodiments. In an embodiment, a light source (e.g., light source of the IEP monitor devices 11, 11a, 11b, 11c) can provide a wide range of spectral wavelengths (UV light and white light) for illuminating a surface of a wafer (substrate). In an embodiment, a tunable laser (e.g., scan device 21, tunable laser 24) can be used for illuminating the surface of the wafer. FIG. 4A is a graph 40 illustrating different beams having different wavelengths that illuminate a surface of a wafer according to an embodiment. Referring to FIG. 4A, the x-axis represents the time in seconds (s) at which spectral interference information is collected. The vertical axis on the right-hand side represents wavelengths in nm, and the vertical axis on the left-hand side represents the intensity of reflectance of wavelengths off the surface of an illuminated substrate in arbitrary units (denoted "arb u."). As shown in FIG. 4A, a light source of an exemplary embodiment emits a range of wavelengths to illuminate a measurement surface of the substrate. The range of wavelengths may include UV wavelengths (between about 220 to about 390 nanometers) and visible wavelengths (between about 400 to about 700 nanometers). In an embodiment, the graph 40 includes first, second, third, fourth, and fifth curves 401, 402, 403, 404, and 405 corresponding to wavelengths 254 nm, 313 nm, 365 nm, 405 nm, and 546 nm, respectively. Each of the curves 401, 402, 403, 404, and 405 contains one or more peaks and valleys indicating thickness variations on the measurement surface of the substrate. These peaks and valleys are results of the constructive and destructive references between the light reflected from grooves (trenches, recesses) and flat surfaces at etched regions of the substrate. For example, the etch depth at a certain time of an etch process can be determined by an amplitude difference between the top of a peak and the bottom of an adjacent valley. In the exemplary embodiment, short wavelengths (254 nm, 313 nm, 365 nm) are absorbed more than long wavelengths (546 nm) for certain layer materials so that these wavelengths do not provide sufficient spectral interference data or information for determining in real-time an etch depth during the first state of the etch process, e.g., during the first 40 seconds of the etch process. In some embodiments, reflectance or spectral interference information can be collected by a sensor, such as a sensor in the IEP monitor device 11, 11a, 11b, 11c (CCD, CMOS image sensor), or an image sensor 22 of FIG. 2A or 2B. In an embodiment, a charge-coupled device (CCD) imaging sensor can convert the collected spectral interference information into corresponding electrical signals that are processed by a computer to obtain the total thickness of a layer and a remaining thickness of the layer. In an embodiment, the phase relation between the different peaks and valleys is a function of a layer thickness. In an embodiment, the amplitude difference between the top of a peak and the bottom of an adjacent valley is a function of an etch depth. In an embodiment, a computer is configured to use the peaks and valleys to monitor the thickness variation or an etch depth of a material layer that has been etched, and after a predetermined amount of etching, instruct an associated etch process to stop. In some embodiments, an IEP apparatus utilizes the spectral interference information to train a machine learning model, as will be described in more detail below.

FIG. 4B is an enlarged schematic view of a portion of an optical emission spectrum (OES) according to an embodiment. Referring to FIG. 4B, the spectral interference pattern shows a peak (constructive interference) and a valley (destructive interference) around a time window of 20 seconds (at time about 40 s and about 60 s) in an etch process, e.g., a plasma etch or reactive ion etch process, that is carried out in the process chamber 12 of FIGS. 1A through 2B. The change of the spectral interference intensity over time for a particular wavelength represents the variation of the etched layer thickness or etched depth. Thus, in this way, the etched depth, the flatness of the surface, or the thickness of the substrate can be known or measured during a given time, and etch rate (which is determined by the etched depth in a given etch time duration) can be calculated. In an embodiment, the OES data are taken during an etch process. In an embodiment, the OES data are spectral interference data having a phase relation between different fringes as a function of wavelengths, and the phase relation represents a layer thickness. In some embodiments, amplitude differences between adjacent peaks and valleys indicate in real-time a state of an etch process so that one or more etch process parameters can be automatically adjusted or changed to compensate for the etch process in real time.

Figure 5A:
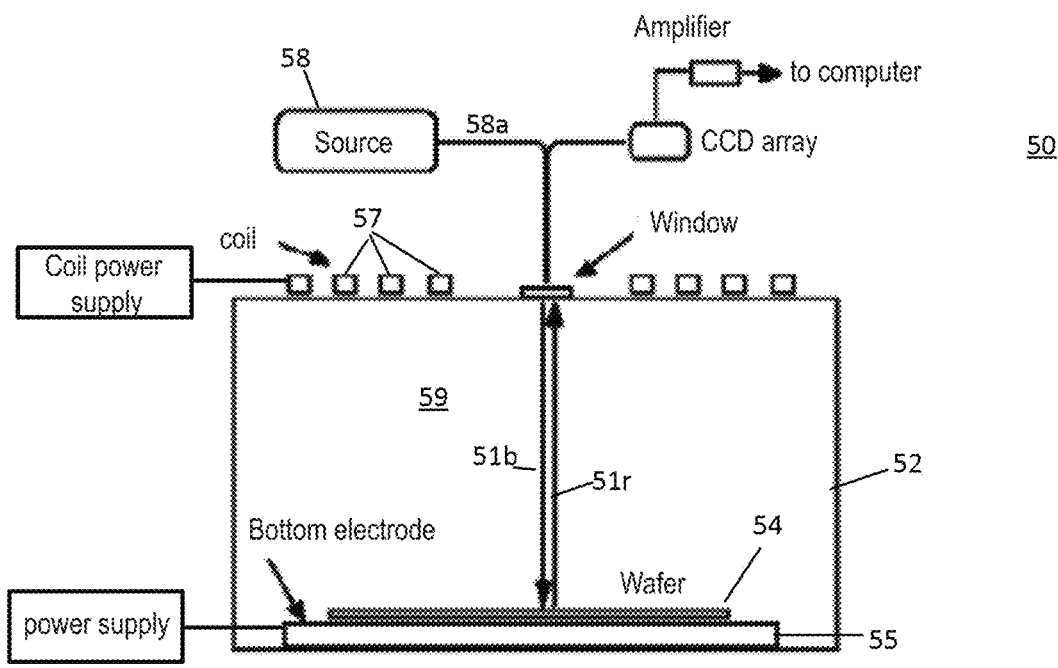
FIG. 5A is a simplified schematic block diagram of an IEP system for controlling a process window according to an exemplary embodiment.

FIG. 5A is a simplified schematic block diagram of an IEP apparatus 50 for controlling a process window according to an exemplary embodiment. The IEP apparatus 50 can be similar or the same as the IEP apparatus 10A, 10B, 20A, 20B, shown and described with reference to FIGS. 1A, 1B, 2A, and 2B, respectively. In this embodiment, one or more image sensors are disposed externally to the process chamber. Referring to FIG. 5A, the IEP apparatus 50 includes a process gas source 58 configured to provide a process gas 58a to a process chamber 52. A plasma is formed in a plasma zone 59 from the process gas 58a by a coil power supply which supplies power to an inductive coil 57. A wafer holding device 55 includes an electrode ("Bottom electrode") disposed therein, which is coupled to a power supply for generating an electric field to facilitate a directional etching of a substrate (wafer) disposed on the wafer holding device. A light source having a light beam 51b illuminates a surface of the substrate during a fabrication operation, such as performing an etch process on a layer of material (oxide, polysilicon, other material). An imaging sensor, e.g., a CCD array, captures light 51r reflected from the surface of the substrate and converts the reflected light into electrical signals. An amplifier amplifies the electrical signals and provides the amplified electrical signals to a computer for processing. In an embodiment, the computer is configured to use the amplified electrical signals to select a process window (denoted "Window"), when an etching depth (endpoint) has been reached. In an embodiment, the window is a time duration of a process operation (e.g., etching) determined by an operator (user). In an embodiment, the computer uses values of peaks and valleys of reflected light or other data points (as shown in FIGS. 4A and 4B) to determine when an endpoint has been reached. It will be appreciated that the CCD array can include one or more of charge-coupled device (CCD) or complementary metal-oxide semiconductor (CMOS) imaging sensors to increase the signal-to-noise ratio and to improve the reflectance information or spectral interference information. In an embodiment, adjacent pixels containing the reflectance information or spectral interference information of each image sensor in the CCD array can be combined to increase the signal-to-noise ratio.

Figure 5B:
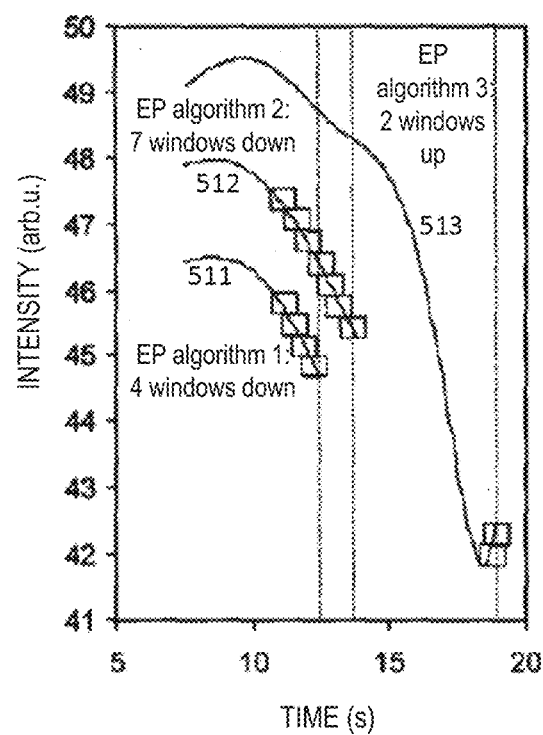
FIG. 5B is a graph illustrating different process windows according to an exemplary embodiment.

FIG. 5B is a graph illustrating some different process windows in an exemplary embodiment. Referring to FIG. 5B, the x-axis represents the time in seconds (s) at which spectral interference information is collected. The vertical axis represents the intensity of reflectance of wavelengths off the surface of an illuminated substrate in arbitrary units (arb. u.). The windows refer to the process windows (denoted "Window") shown in FIG. 5A. In this embodiment, the computer uses the intensity values of peaks and valleys (spectral interference information or spectra data) to determine when an endpoint has been reached. In an embodiment, the computer selects a predetermined endpoint (EP) algorithm from a database associated with etching depths. For example, a window may be a time duration (e.g., 0.5 second) of an etch process. In an exemplary embodiment, to avoid damaging a gate oxide, the computer can change the bias voltage, the coil current, the temperature of a region of the substrate, and the like to slow down the etch process or stop the etch process after a time duration, for example, the computer can select to delay an etching operation by 2 seconds, i.e., four windows down, from a peak when an endpoint has been reached. This process corresponds to a first endpoint algorithm (EP algorithm 1) with each square (rectangle) representing a window shown as curve 511. In another exemplary embodiment, the computer can select to delay an etching operation by 3.5 seconds, i.e., seven windows down, when an endpoint has been reached. This process corresponds to a second endpoint algorithm (EP algorithm 2) with each square (rectangle) representing a window shown as curve 512. In an exemplary embodiment, the computer can stop an etch process early after an endpoint (defined by a valley) has been reached. This process corresponds to a third endpoint algorithm (EP algorithm 3) with each square (rectangle) representing a window shown as curve 513.

FIG. 6A is a simplified schematic block diagram illustrating an interferometer endpoint (IEP) apparatus 60 having a beam conditioning assembly disposed in a center region of a ceiling of a process chamber, where the beam conditioning assembly includes a multiple input multiple output (MIMO) orthogonal frequency division multiplexing (OFDM) device according to an exemplary embodiment. The IEP apparatus 60 is similar to the IEP apparatus 10A with the difference that the IEP monitor device 11 is replaced by a beam conditioning assembly that performs the directivity and selectivity of spectral wavelengths of the light source. Referring to FIG. 6A, the IEP apparatus 60 has a beam conditioning assembly 61 disposed above a center region a substrate 14. In an embodiment, the beam conditioning assembly 61 is mounted in a center region of the ceiling 12b of a process chamber 12. The substrate 14 is arranged on a wafer holding device 15, such as a pedestal or an electrostatic chuck (ESC) disposed in the process chamber 12 according to an exemplary embodiment. The beam conditioning assembly 61 includes a light source having spectra of a plurality of wavelengths to illuminate the substrate and a sensor for receiving reflected light from the substrate. In an embodiment, the spectra of the plurality of wavelengths can include one or more of visible, infrared, near infrared, or ultraviolet light. In an embodiment, the beam conditioning assembly 61 includes a multiple input multiple output (MIMO) orthogonal frequency division multiplexing (OFDM) device coupled to a plurality of antenna elements. The beam conditioning assembly 61 also includes a spectrum meter for measuring spectra data of light reflected from a surface of the substrate.

FIG. 6B is an enlarged schematic view of a MIMO OFDM device 63 according to an embodiment. In some embodiments, the MIMO OFDM device 63 can be a part of the beam conditioning assembly 61 of FIG. 6A. Referring to FIG. 6B, the MIMO OFDM device 63 provides a plurality of OFDM signals 631a, 631b, 631c, 631d, 631e, each having a different frequency or wavelength. The OFDM signals 632a, 632b, 632c, 632d, 632e are sent to a surface of the substrate 14 from a plurality of antenna elements 634. Frequency signals 633a, 633b, 633c, 633d, 633e reflected from the surface of the substrate are received by the plurality of antenna elements 634 and provided to a spectrum meter (not shown). The spectrum meter converts the received frequency signals or wavelengths 633a, 633b, 633c, 633d, 633e to respective electrical signals. An amplifier (not shown) amplifies the electrical signals and provide them to a computer for processing.

Figure 6C:
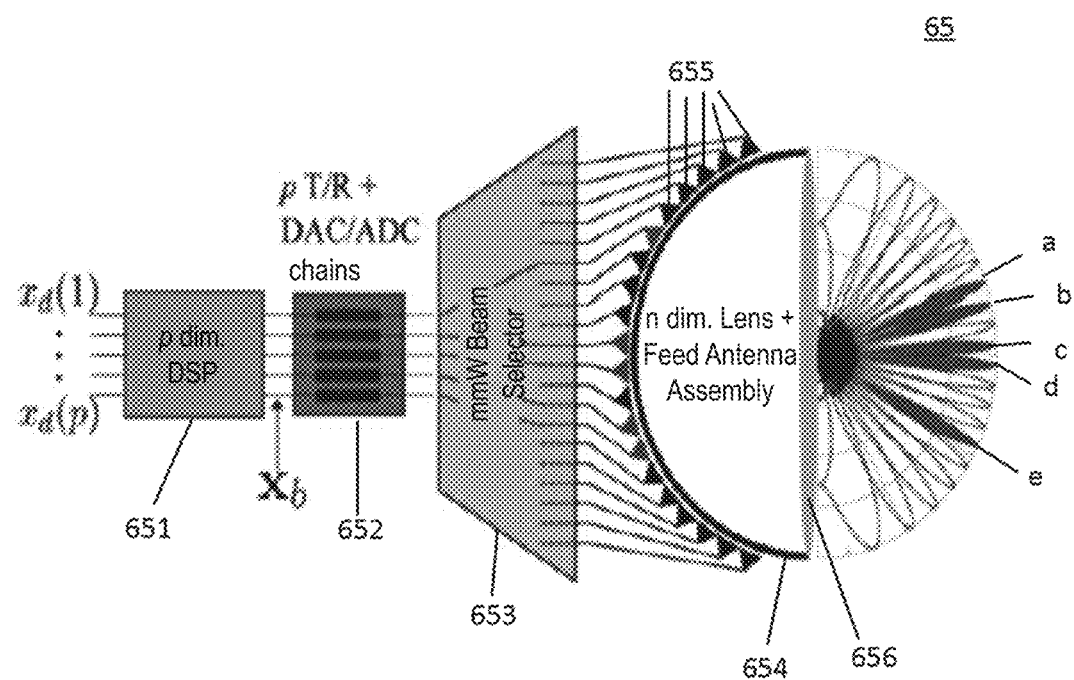
FIG. 6C is a schematic block diagram of a MIMO OFDM device according to an embodiment.

FIG. 6C is a schematic block diagram of a beam conditioning assembly 65 according to an exemplary embodiment. The beam conditioning assembly 65 includes a MIMO transmitter and a MIMO receiver (MIMO transceiver). Referring to FIG. 6C, time-domain data xd(1) to xd(p) are provided to a p dimensional DSP (digital signal processing)

device 651. In an embodiment, the p dimensional DSP device 651 performs an inverse discrete Fourier transform (iDFT) on the data to map the time-domain data to corresponding subcarriers Xb, hence creating an OFDM symbol having p subcarriers. In an embodiment, the OFDM symbol with the p subcarriers is provided to a MIMO transceiver including a digital-analog converter (DAC) and analog-digital converter (ADC) 652. The ADC converts the subcarriers to frequency-domain analog signals in the transmit direction. The DAC converts the received subcarriers to time-domain digital signals and provide the time-domain digital signals to the p dimensional DSP device 651 for demodulation. It is understood that not all the subcarriers of the OFDM symbol are used. A millimeter wavelength beam selector 653 passes through selected wavelengths to an antenna assembly 654. In an embodiment, the antenna assembly 654 includes a plurality of antenna elements 655 arranged in an arc shape or a spherical configuration in one-dimensional or two-dimensional direction. In another embodiment, the plurality of antenna elements 655 are arranged in a one-dimensional or two-dimensional planar structure. It is noted that the number of antenna elements and the number of subcarriers are different. The plurality of antenna elements 655 form a beam device (or beam former) operative to simultaneously form different beams of different wavelengths to irradiate a surface of a processed substrate. In an embodiment, the MIMO transmitter is configured to provide m transmit signals (m beam of different wavelengths) to irradiate the substrate surface, and the MIMO receiver is configured to receive m reflected signals from the irradiated surface of the substrate. The number of wavelength beams is a parameter determined by design of the antenna array and is not limited to the number shown in FIG. 6C. A greater or smaller number of beams is possible depending on applications. In an embodiment, the MIMO OFDM device 65 also includes an electromagnetic lens 656 disposed in front of the antenna assembly 654 and configured to expand or magnify the angle of the received beams of wavelengths reflected from the surface of the substrate. Although FIG. 6C shows five beams a, b, c, d, e are used for measuring etched depths of different layers of material, a greater or smaller number of beams is possible. In some embodiments, the plurality of antenna elements 655 can direct the beams having the same wavelength in many different directions at the same time. In some other embodiments, the plurality of antenna elements 655 can direct a plurality of beams having different wavelengths in a same direction or different directions.

Figure 7:
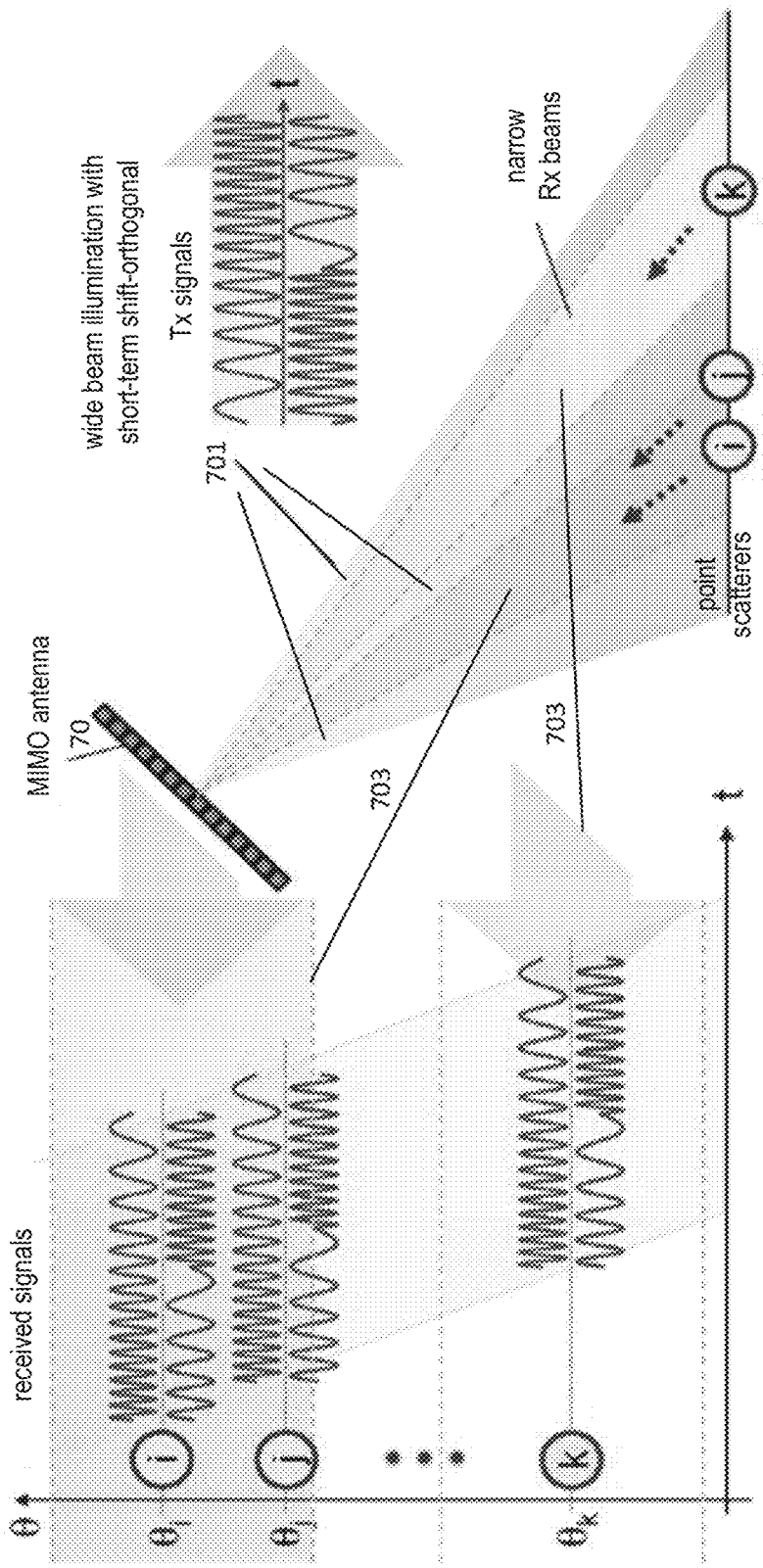
FIG. 7 is a graph illustrating transmitted signals and received signals of an OFDM device having a MIMO antenna array according to an exemplary embodiment.

FIG. 7 is a graph illustrating transmitted signals and received signals of an OFDM device having a MIMO antenna array 70 according to an exemplary embodiment. The MIMO antenna can include a plurality of antennas as the antennas 634 of FIG. 6B or the antenna assembly 654 of FIG. 6C. Referring to FIG. 7, the MIMO antenna array 70 can have a plurality of antenna elements arranged in a one-dimensional or two-dimensional planar or spherical configuration. The MIMO antenna array 70 receives signals from the OFDM device (not shown) and transmits one or more beams 701 having a predetermined range of discrete wavelengths to a surface of a substrate, some of the wavelengths 703 are reflected from the surface of the substrate and captured by the MIMO antenna array 70, and some other wavelengths are absorbed by the substrate or have a magnitude too small to be picked up by the MIMO antenna array. The captured wavelengths are converted to electrical signals by a spectrum meter in the OFDM device for further processing.

Figure 8:
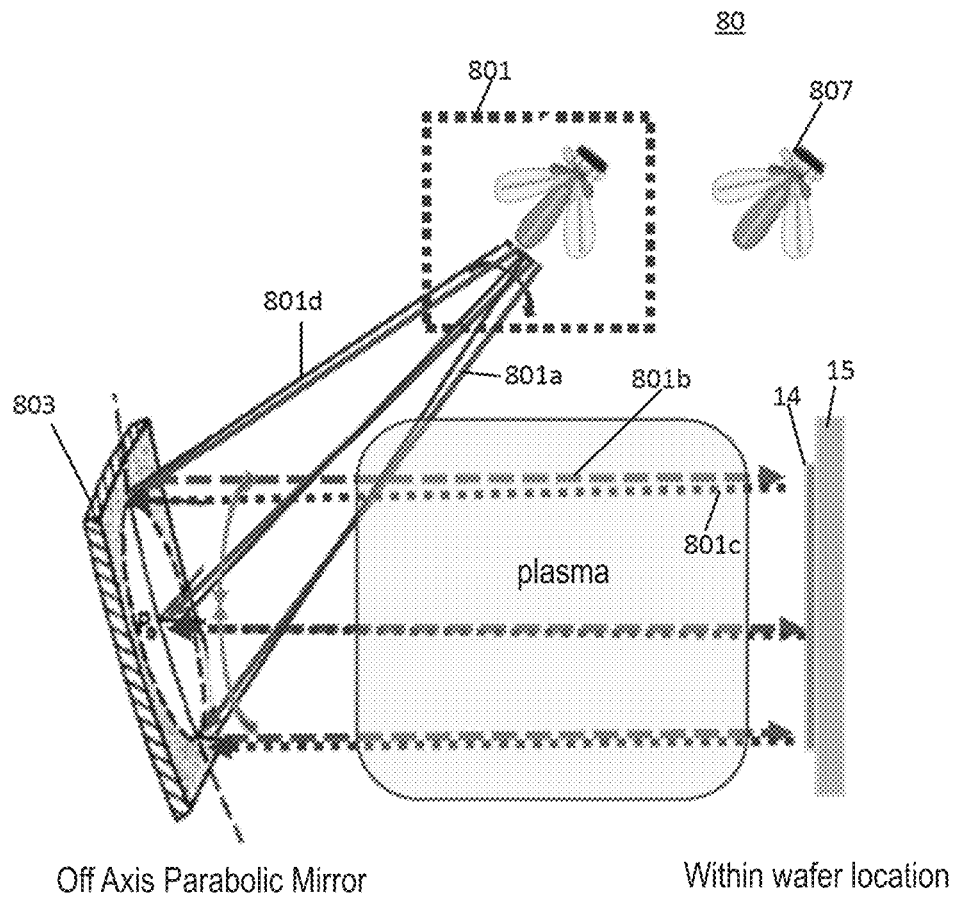
FIG. 8 is a simplified schematic block diagram illustrating an interferometer endpoint (IEP) system having a MIMO OFDM device and an off-axis parabolic mirror according to an exemplary embodiment.

FIG. 8 is a simplified schematic block diagram illustrating an interferometer endpoint (IEP) system 80 having a MIMO OFDM device 801 and an off-axis parabolic mirror 803 according to an exemplary embodiment. The IEP system 80 can be similar to the IEP system 20A of FIG. 2A, where the scan device 21 is replaced by the MIMO OFDM device 801 that is configured to direct a beam in different directions across a portion of the off-axis parabolic mirror. The MIMO OFDM device 801 and an off-axis parabolic mirror 803 are disposed in a process chamber and configured to illuminated a surface of a substrate 14 disposed on an electrostatic chuck 15. Referring to FIG. 8, the MIMO OFDM device 801 may have a similar structure as that shown and described in FIG. 6C. In this embodiment, the off-axis parabolic mirror 803 is mounted on a sidewall of a process chamber, but it is understood that the off-axis parabolic mirror 803 can be mounted on the ceiling of the process chamber as shown and described with regard to FIG. 2A. In an embodiment, the IEP system 80 also includes a laser device 807 configured to emit a beam for heating a surface portion of the substrate. In an embodiment, the MIMO OFDM device 801 includes an antenna array having a plurality of antenna elements configured to steer selected wavelengths 801$a$ to a surface of the off-axis parabolic mirror 803. The selected wavelengths 801$a$ are reflected by the off-axis parabolic mirror 803 as nearly parallel wavelengths 801$b$ that irradiate perpendicularly the surface of the substrate. Wavelengths 801$c$ reflected from the surface of the substrate arrive nearly parallel to the off-axis parabolic mirror 803 and reflected back to the MIMO OFDM device 801 as wavelengths 801$d$. The reflected wavelengths contain spectra interference information that can be used to control parameters of an etch process.

Figure 9:
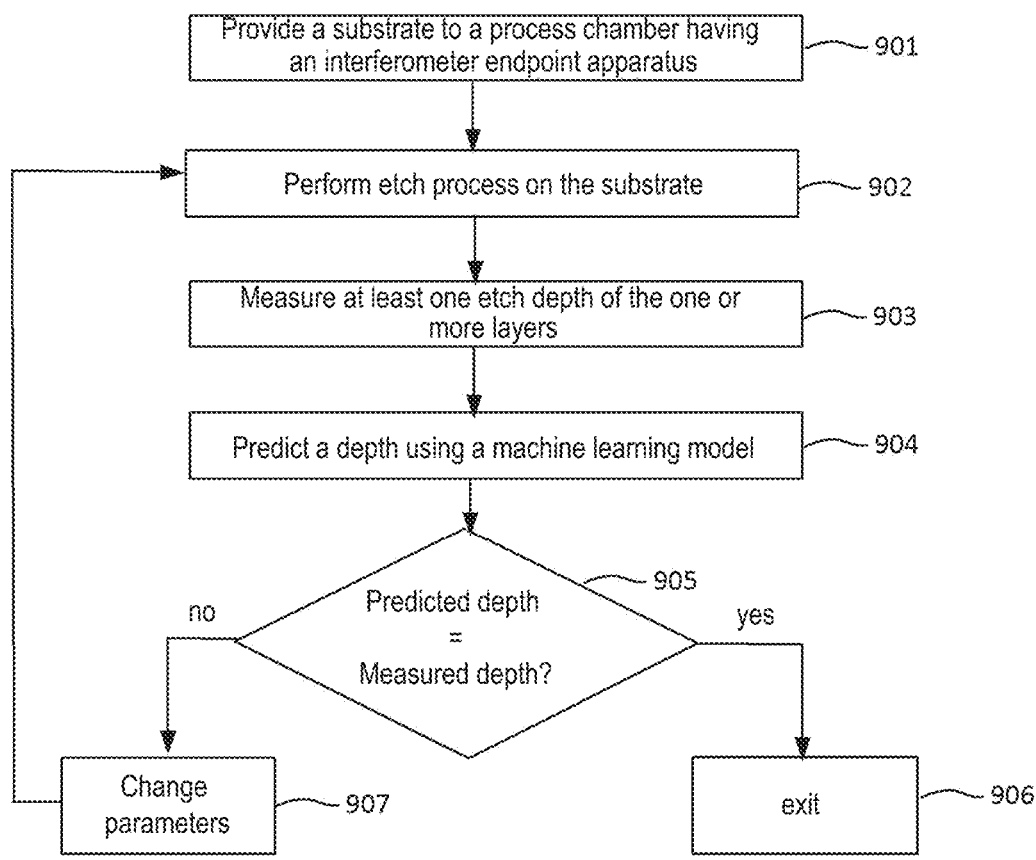
FIG. 9 is a flowchart illustrating a method of etch process compensation control in real-time according to an exemplary embodiment.

FIG. 9 is a flowchart illustrating a method 90 of etch process compensation control in real-time according to an exemplary embodiment. Referring to FIG. 9, the method 90 includes providing a substrate to a process chamber having an interferometer endpoint apparatus (IEP) (step 901). The IEP apparatus can be one of the IEP apparatus shown and described with reference to FIGS. 1A, 1B, 2A, 2B, 6A, 6B, 6C, and 8. The method 90 also includes performing an etch process on one or more layers to be etched on the substrate (step 902). The one or more layers to be etched may include a silicon oxide layer, a silicon nitride layer, a silicon oxynitride layer, a polysilicon layer, and the like. The method 90 also includes measuring at least one etch depth of the one or more layers to obtain a measured depth (step 903). The method 90 further includes predicted a depth using a machine learning model to obtain a predicted depth (step 904). Next, the method 90 further includes determining whether the predicted depth is approximately equal to the measured depth (step 905). If the predicted depth is determined to be approximately equal to the measured depth, the method includes determining that the etch process has good etch uniformity and exiting the process (step 906). If the predicted depth is determined to be not equal to the measured depth, the method includes changing etch process parameters, such as varying the coil current, the bias voltage of the substrate, etch step time, ratio of precursor gases, temperature of regions or zones of the substrate, and the like (step 907). Thereafter, the method 90 includes performing the etch process with the new process parameters (step 902), measuring the etched depth, fine tuning the machine learning model (step 904) to enhance data in the process library, and repeating steps 902 through 905 until the measured etch depth is equal to the predicted depth and exit the process (step 906).

Figure 10A:
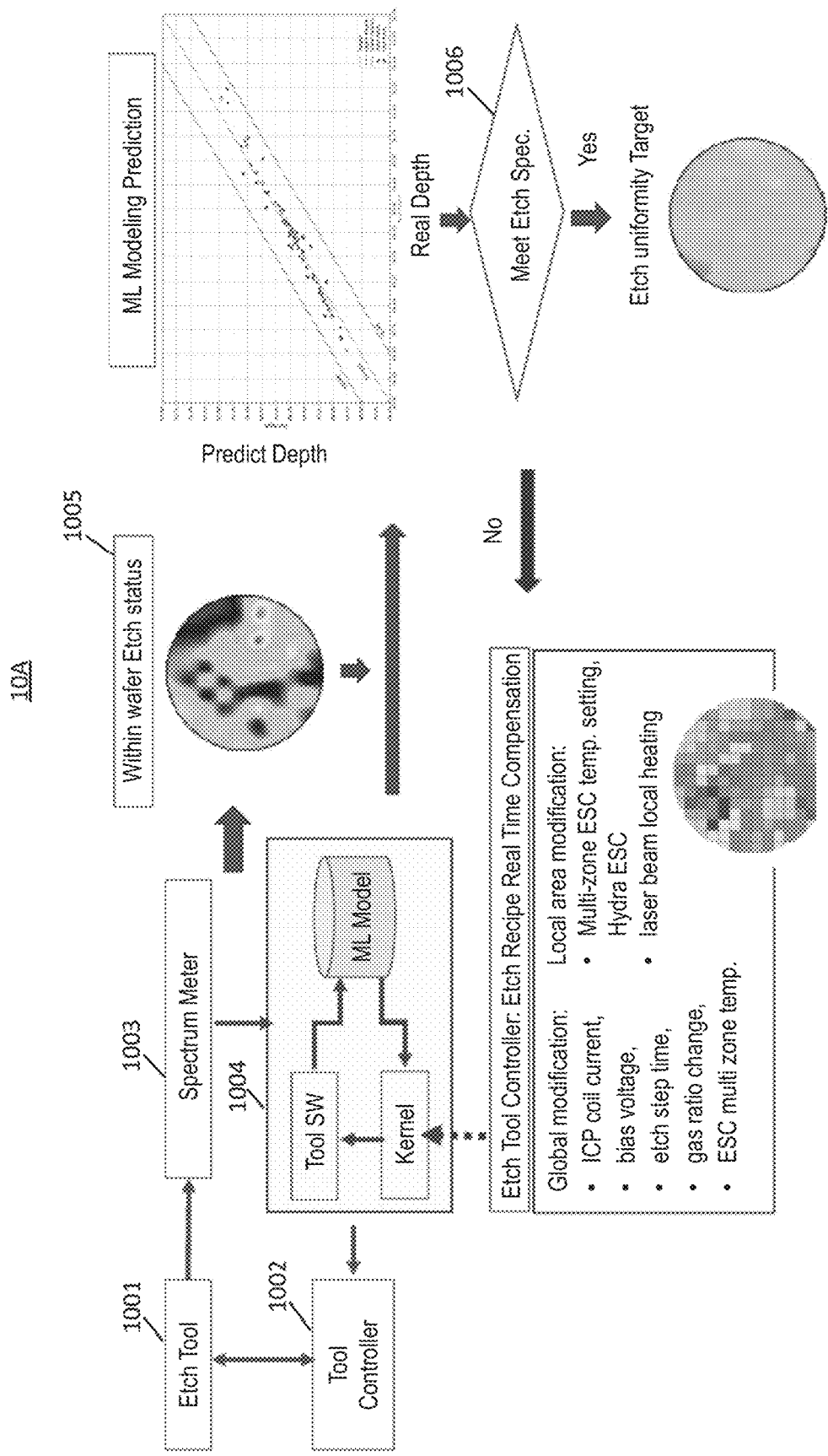
FIG. 10A is a simplified block diagram illustrating a work flow of a real-time an etch process compensation system according to an exemplary embodiment.

FIG. 10A is a simplified block diagram illustrating a work flow 10A of a real-time etch process compensation control system according to an exemplary embodiment. Referring to FIG. 10A, the real-time etch process compensation control system includes one or more etch tools 1001 in communication with a tool controller 1002. The tool controller 1002 operates in real-time to communicate with the one or more etch tools 1001. A spectrum meter 1003 receives spectra data of a processed substrate and sends etch information to a kernel machine 1004 for fine tuning a machine learning model. During a process, the etch tool 1001 and the spectrum meter 1003 obtain measured etch data in a same substrate or different substrates and provide the measured data to the kernel machine 1004 to create and adjust prediction data, e.g., predicted etch depth data. In an exemplary embodiment, the etch status 1005 of a trench or a through hole can be determined (e.g., the trench depth or though hole depth is measured) by the spectrum meter. The predicted depth data is compared with the real (measured) depth data (1006). When the prediction data is equal to the measured data, the real-time etch process compensation control system determines that the tool controller has the correct etch recipe and the etch process meets the etch uniformity target. When the prediction data (predict depth) is not equal to the measured data (real depth), the real-time etch process compensation control system updates or modifies the etch parameters either globally or locally. A global modification includes a change of ICP coil current, bias voltage, etch step time, gas ratio, a temperature modification of certain zones in the electrostatic chuck (ESC), or combinations thereof. A local area modification includes a temperature modification of certain zones in the electrostatic chuck (ESC), laser beam local heating, or combinations thereof. The modified process recipe is sent to the tool controller to update process parameters of the one or more etch tools 1001. In some embodiments, the spectrum meter 1003 can be the IEP apparatus 10A, 10B, 20A, 20B, 60, 80 of FIGS. 1A, 1B, 2A, 2B, 6, and 8, respectively. In some embodiments, the measured data can include thicknesses, etched depths of measured surfaces of one or more substrates within a wafer or among multiple wafers. The measured data can be used to tune or optimize the etch tools 1001.

Figure 10B:
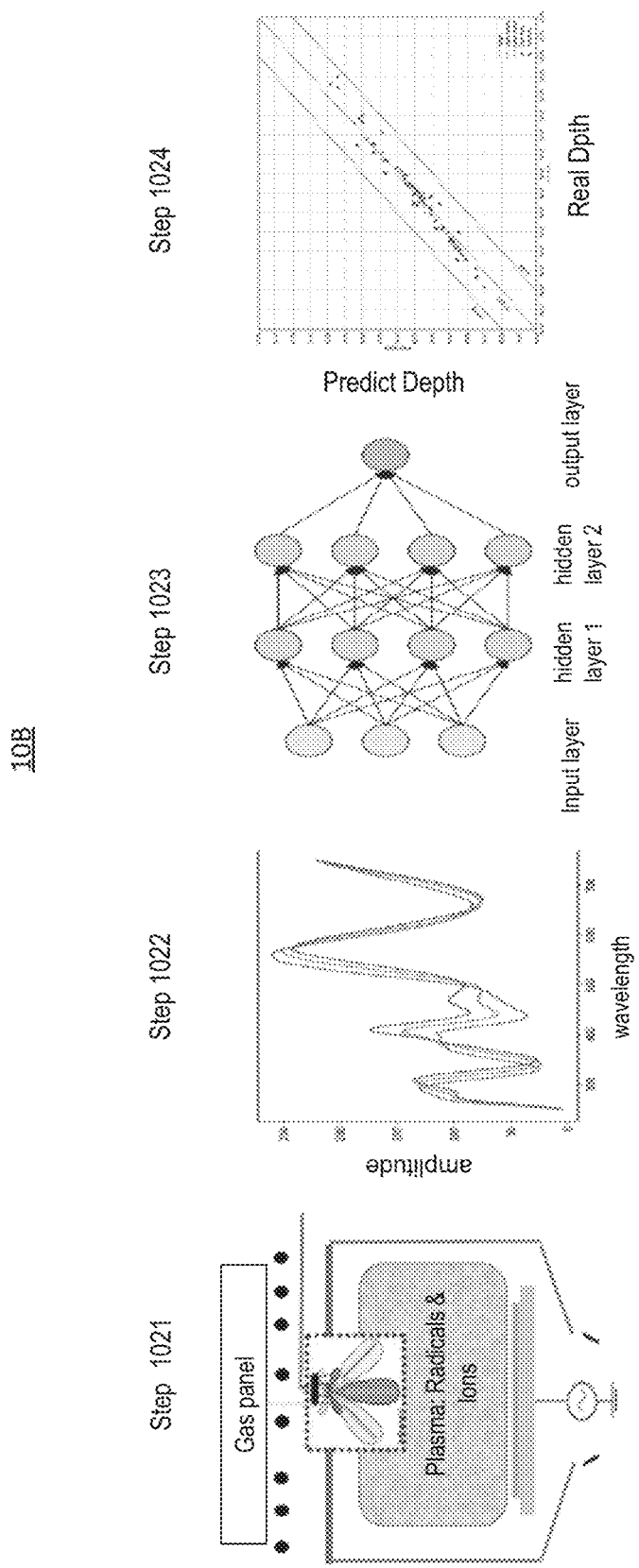
FIG. 10B is a simplified block diagram illustrating a work flow 10B of obtaining a machine learning algorithm model according to an exemplary embodiment.

FIG. 10B is a simplified block diagram illustrating a work flow 10B of obtaining a machine learning algorithm model according to an exemplary embodiment. Referring to FIG. 10B, a process chamber including an IEP device is provided at step 1021. The IEP device can be one of the IEP device shown and described in connection with FIGS. 1A, 1B, 2A, 2B, 6A, 6B, 6C, and 8. A light source including one or more wavelengths irradiates a surface of a processed substrate arranged in the process chamber. In an embodiment, a MIMO OFDM IEP device is used to irradiate the substrate and collect spectra data in-situ (step 1021). In an embodiment, the wavelengths are in a range from 200 nm to 800 nm. The collected spectra data having peaks and valleys of the processed substrate is then cleaned, i.e., noises and outliers are removed (step 1022). The collected spectra data is provided to a kernel machine for training a machine learning model (step 1023). In an embodiment, the machine learning model includes an input layer, at least two hidden layers, and an output layer. The process of building the machine learning algorithm model is performed in real-time by comparing the prediction data (e.g., predict depth) with the measured data (real depth) (step 1024). Any discrepancy between the prediction data and the measured data is fed back to the kernel machine to modify the process parameters (etch recipe) in real-time, as shown in FIG. 10A.

Figure 10C:
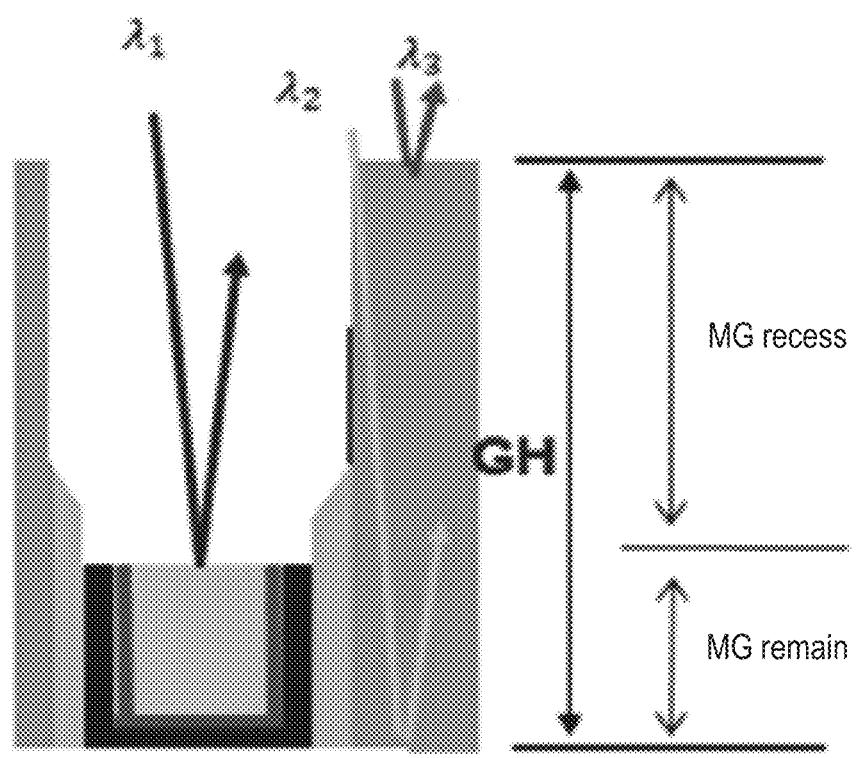
FIG. 10C is a cross-sectional view illustrating a depth measurement of a gate according to an exemplary embodiment.

FIG. 10C is a cross-sectional view illustrating a depth measurement of a gate according to an exemplary embodiment. In an embodiment, a portion of a metal gate layer needs to be removed to obtain a remaining metal gate layer having a desired thickness. A process may include removing a top portion of the meta gate layer by etching. Referring to FIG. 10C, a remaining thickness of a metal gate (denoted "MG remain") can be calculated by obtaining the total thickness or height (denoted "GH") of the gate and a depth of recess (denoted "MG recess"). In an embodiment, the depth of recess of the metal gate can be obtained using a first reflectance measurement with a first wavelength $\lambda 1$, and the gate height or depth GH can be obtained using a second reflectance measurement with a second wavelength $\lambda 2$. The remaining thickness of the metal gate is calculated by the difference between GH and MG recess (MG remain=GH−MG recess).

As described above, variations and tolerances in the process chamber can cause non-uniformities in the processed substrate. Accordingly, in some embodiments, the electrostatic chuck (ESC) has a plurality of regions each having a temperature that can be individually monitored and controlled to compensate for temperature non-uniformities. In an embodiment, the ESC has a plurality of concentric radial zones extending from the center to the periphery of the ESC. The radial zones are configured to cover the entire surface of the substrate disposed thereon. Temperature of each of the radial zones can be individually monitored and controlled. In an exemplary embodiment, each zone has at least one temperature sensor, at least one radial heating element, and/or at least one radial cooling element having one or more channels configured to flow a coolant (cooling fluid).

Figure 11A:
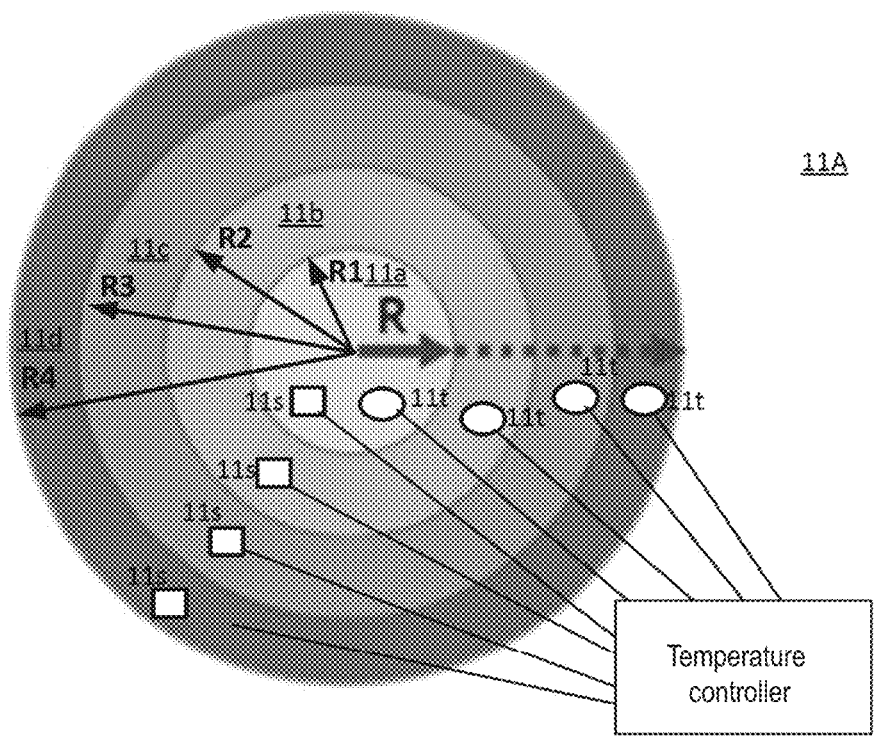
FIG. 11A is a simplified block diagram illustrating a radial multi-zone thermal sensing and control according to an exemplary embodiment.

FIG. 11A is a simplified block diagram illustrating an ESC 11A for radial multi-zone thermal sensing and control according to an exemplary embodiment. Referring to FIG. 11A, the ESC 11A has a plurality of concentric macro zones including macro zones 11a, 11b, 11c, and 11d. The first macro zone 11a has a first radius R1, the second macro zone 11b has a second radius R2, the third macro zone 11c has a third radius R3, and the fourth macro zone 11d has a fourth radius R4 being the largest radius of the ESC 11A. In some embodiments, the fourth radius R4 is approximate equal to a radius of a to-be processed substrate disposed on the ESC 11A. In the example shown in FIG. 11A, four macro zones are shown, but it is understood that the number is illustrative only and should not be limiting. For example, the number of macro zones can be fewer or more than four in some embodiments.

In an embodiment, each of the macro zones 11a, 11b, 11c, and 11d includes a temperature sensor 11s and a temperature control device 11t. In an exemplary embodiment, the temperature control device 11t includes a heating element and a cooling element. In an embodiment, the heating element of the temperature control device 11t is a thermal resistor, the cooling element is a circular hollow tube for flowing a coolant. In an embodiment, the temperature sensors and the temperature control devices of the macro zones are coupled to a temperature controller that is configured to control a local temperature of each macro zone based on temperature data received from an associated temperature sensor. For this purpose, the temperature sensor 11s in each macro zone may include a plurality of sensors distributed along a circular path within a macro zone, and the temperature control device 11t may include a plurality of heating elements each associated with a respective sensor. Thus, temperature of a region or portion within a macro zone can be individual monitored and controlled. In an embodiment, the temperature controller is external to the process chamber and is in communication with one or more computer systems in a cloud computer environment.

Figure 11B:
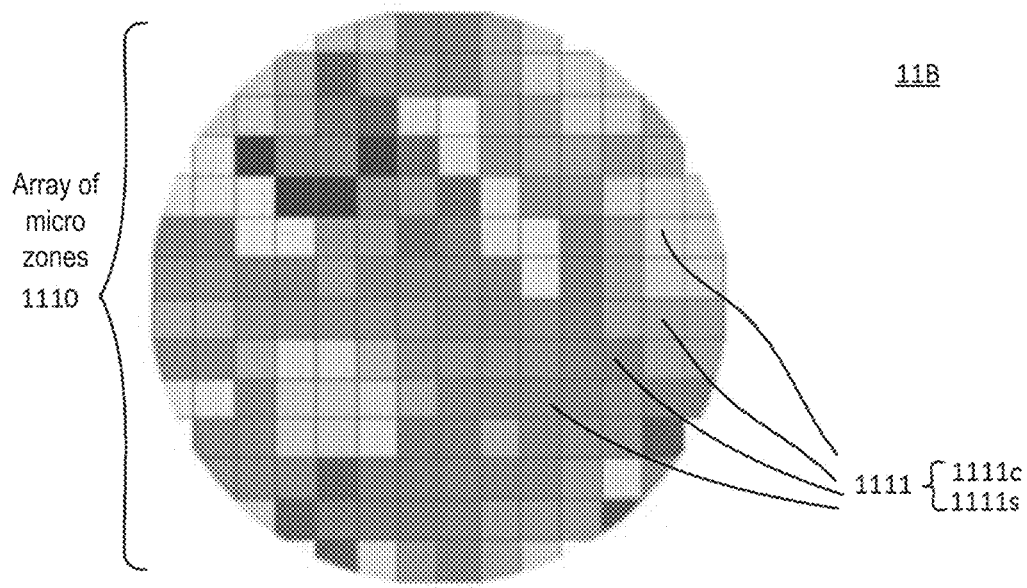
FIG. 11B is a simplified block diagram illustrating a micro multi-zone thermal sensing and control according to an exemplary embodiment.

In some embodiments, the ESC has an array of micro zones arranged through the surface of the ESC, each of the micro zones includes a temperature sensor, a heating element, and/or a cooling element. FIG. 11B is a simplified block diagram illustrating an ESC 11B including a micro multi-zone thermal sensing and control according to an exemplary embodiment. Referring to FIG. 11B, the ESC 11B has a two-dimensional array 1110 of micro zones 1111, each micro zone 1111 has a thermoelectric device including a temperature sensor 1111s and a temperature control device 1111c. In an exemplary embodiment, the temperature sensor 1111s and the control device 1111c. In an embodiment, the thermoelectric device may be a device operating based on the Seebeck effect and/or the Peltier effect. In an embodiment, each of the micro zones has a square shape and can be located by its two-dimensional XY orthogonal coordinates.

In some embodiments, the electrostatic chuck (ESC) can have both the concentric macro zones in FIG. 11A and the array of micro zones in FIG. 11B, so that a substrate disposed thereon can be coarsely or finely monitored and controlled.

Figure 12:
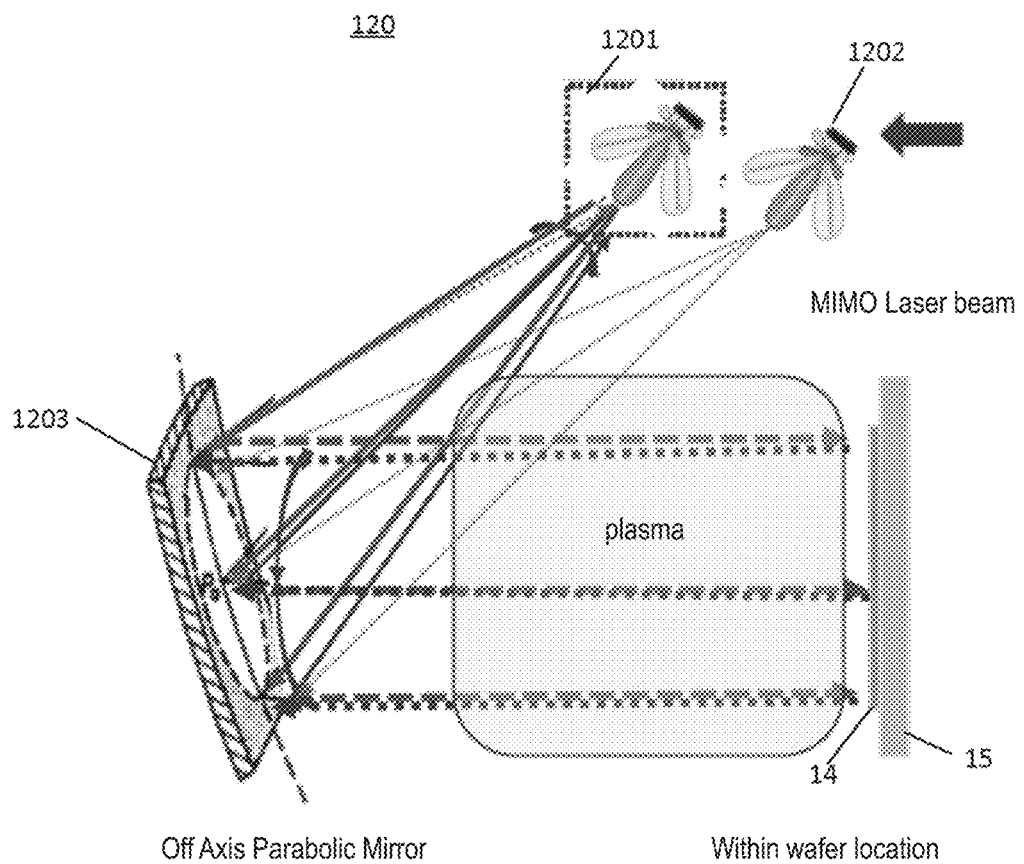
FIG. 12 is a simplified schematic block diagram illustrating an interferometer endpoint (IEP) system having a MIMO OFDM device, a MIMO laser device and an off-axis parabolic mirror for a multi-zone thermal control according to an embodiment.

FIG. 12 is a simplified schematic block diagram illustrating an interferometer endpoint (IEP) system 120 having a MIMO OFDM device (beam conditioning assembly) 1201, a MIMO laser device 1202, and an off-axis parabolic mirror 1203 for a multi-zone thermal monitoring and control according to an exemplary embodiment. The MIMO OFDM device 1201, the MIMO laser device 1202, and the off-axis parabolic mirror 1203 are disposed in a process chamber. The MIMO OFDM device 1201 is configured to illuminated a surface of a substrate 14 disposed on an electrostatic chuck 15. Referring to FIG. 12, the MIMO OFDM device 1201 may have a similar structure as that shown and described in FIG. 6C. In this embodiment, the off-axis parabolic mirror 1203 is mounted on a sidewall of a process chamber, but it is understood that the off-axis parabolic mirror 1203 can be mounted on the ceiling of the process chamber as shown and described with regard to FIG. 2A. The off-axis parabolic mirror 1203 is facing the surface of the substrate 14 and configured to receive wavelengths from the MIMO OFDM device 1201 and direct the collimated wavelengths toward a surface of the substrate 14. The off-axis parabolic mirror 1203 directs the radiation reflected from the surface of the substrate back to the MIMO OFDM device 1201, that transforms the radiation of wavelengths into time-domain digital signals for further processing by a computer.

As described in FIGS. 10A to 10C, spectral data received by the MIMO OFDM device 1201 can be used by the IEP system 120 to train a machine learning model that is configured to predict an etch depth for a region of the substrate. In some embodiments, the IEP system 120 then modifies process parameters, such as ICP (inductively-coupled plasma) coil current, bias voltage, etch step time, gas ratio, and temperature of the electrostatic chuck 15 in a global modification based on a comparison result of a predicted etch depth and a measured etch depth. In some other embodiments, the IEP system 120 makes local area modifications, such as locally changing the temperature in response to the comparison result. In an embodiment, the IEP system 120 changes the temperature of an annular zone of the electrostatic chuck 15 using the heating and cooling structure in FIG. 11A. In an embodiment, the IEP system 120 may raise a temperature of a narrow region of the substrate by irradiating the narrow region using the MIMO laser device 1202. In an embodiment, the MIMO laser device 1202 includes a plurality of antenna elements configured to direct a laser beam to heat a certain surface region of the substrate to raise the temperature to change the etch rate to improve etch rate uniformity across the surface of the substrate.

Figure 13:
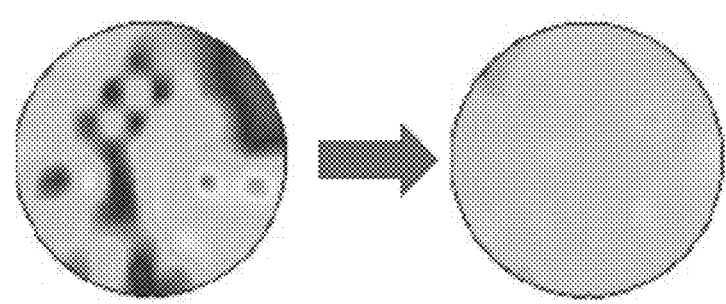
FIG. 13 is an image of a processed wafer that has been processed based on a work flow according to an embodiment.

FIG. 13 is an image of a processed wafer that has been processed based on a work flow according to an embodiment. As shown in FIG. 13, a substrate processed with a conventional etch techniques has non-uniform etch depths (indicated by dark spots), and a substrate processed by the system 120 has a uniform etched depth (the wafer on the right-hand side).

Figure 14:
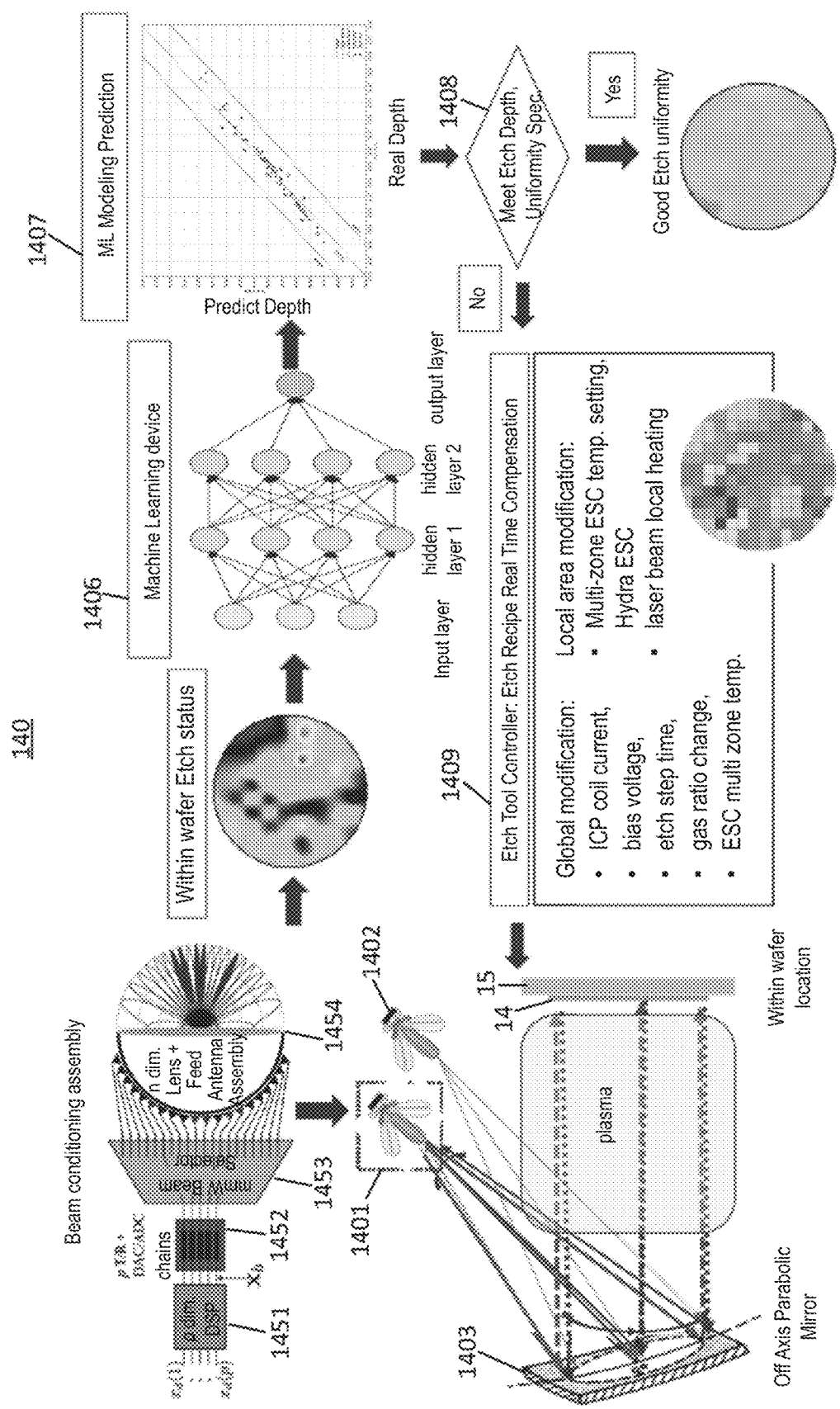
FIG. 14 is a simplified block diagram illustrating a work flow of a real-time an etch process compensation according to an exemplary embodiment.

FIG. 14 is a simplified block diagram illustrating a work flow of a real-time an etch process compensation control system 140 according to an exemplary embodiment. Referring to FIG. 14, the real-time etch process compensation control system 140 includes a MIMO OFDM device 1401, a MIMO laser device 1402, an off-axis parabolic mirror 1403, and a machine learning device 1406 for a multi-zone thermal monitoring and control in real-time. The MIMO OFDM device (beam conditioning assembly) 1401, the MIMO laser device 1402, and the off-axis parabolic mirror 1403 are disposed in a process chamber (not shown). The MIMO OFDM device 1401 is configured to illuminated a surface of a substrate 14 disposed on an electrostatic chuck 15. The MIMO OFDM device 1401 may have a similar structure as that shown and described in FIG. 6C, i.e., the MIMO OFDM device 1401 includes a p-dimensional DSP (digital signal processing) device 1451, that performs Fourier transform operations, e.g., FFT, iFFT, iDFT, DFT and others to map time-domain signals to frequency-domain signals, and vice versa. For example, discrete time-domain data xd(1) to xd (p) are mapped to corresponding subcarriers Xb, forming an OFDM symbol having p subcarriers. In an embodiment, the OFDM symbol with the p subcarriers is provided to a MIMO transceiver including a digital-analog converter (DAC) and analog-digital converter (ADC) 652. The ADC converts the subcarriers to frequency-domain analog signals in the transmit direction. The DAC converts the received subcarriers to time-domain digital signals and provide the time-domain digital signals to the p dimensional DSP device 651 for demodulation. In some embodiments, not all the subcarriers of the OFDM symbol are used. A millimeter wavelength beam selector 1453 passes through selected wavelengths to an antenna assembly 1454. In an embodiment, the antenna assembly 1454 includes a plurality of antenna elements 1455 arranged in an arc shape or in a spherical configuration in one-dimensional or two-dimensional direction. In another embodiment, the plurality of antenna elements 1455 are arranged in a one-dimensional or two-dimensional planar structure.

In an embodiment, the off-axis parabolic mirror 1403 is mounted at a ceiling of the process chamber as shown and described with regard to FIG. 2A. In this embodiment, the off-axis parabolic mirror 1403 is shown to be mounted on a sidewall of the process chamber and facing the surface of the substrate 14 and configured to receive wavelengths from the MIMO OFDM device 1401 and direct the collimated wavelengths toward a surface of the substrate 14. The off-axis parabolic mirror 1403 directs the radiation reflected from the surface of the substrate back to the MIMO OFDM device 1401, that transforms the radiation of wavelengths into time-domain digital signals (e.g., spectra data as shown in FIGS. 4A and 4B) through the ADC and DSP for further processing by the machine learning device 1406.

In an embodiment, the machine learning device 1406 includes an input layer, two hidden layers (hidden layer 1, hidden layer 2), and an output layer. In this embodiment, the machine learning device 1406 has two hidden layers, but it is understood that the number is illustrative only and should not be limiting. Spectra data, e.g., intensity of wavelengths captured during an etch process of the substrate, are processed by the machine learning device 1406 to create a machine learning model of predicted etch depths based on reflection of wavelengths. A graph 1407 illustrates a machine learning prediction according to an exemplary embodiment. The x-axis represents real depth (i.e., measured etch depth) during an etch process, the y-axis represents the predict etch depth provided by the machine learning device. In an embodiment, the real-time etch process compensation control system 140 compares the predict etch depth with the real depth (1408). When the predict depth matches the measured depth within a predetermined tolerance, the real-time etch process compensation control system 140 determines that the machine modeling model is correct, the substrate has good etch uniformity, and the etch process in the process chamber under the current etch recipe can be maintained. When the predict depth does not match the measured depth, the real-time etch process compensation control system 140 determines that process changes are to be made either globally or locally (1409). A global modification can includes a change in the ICP coil current, bias voltage, etch step time, gas ratio, temperature in the multiple zones of the electrostatic chuck, or combinations thereof. A local area modification can include a change in the temperature of the multiple zones of the electrostatic chuck, and by locally heating of the substrate by the MIMO laser device 1402. The modified process recipe is provided to the process chamber to update process. In an embodiment, when the etch depth is determined to be shallow in a certain region, i.e., the etch rate is too slow in that region, the etch process compensation control system 140 will uses the MIMO laser device 1402 to direct an infrared (IR) beam to heat up that region for a real-time etch compensation.

In an embodiment, an apparatus includes a beam conditioning assembly configured to output one or more wavelengths to a substrate being processed and receive one or more reflected wavelengths from the substrate, and a machine learning device configured to process the one or more reflected wavelengths to predict a process variable and compare the predicted process variable with a measured process variable to obtain a comparison result.

In an embodiment, a system includes a process chamber for processing one or more layers on a substrate. The process chamber includes a beam conditioning assembly configured to output one or more wavelengths, an off axis parabolic mirror configured to direct the one or more wavelengths to a region of the substrate and receive one or more reflected wavelengths from the region of the substrate, and a platform configured to support the substrate. In an embodiment, the platform is an electrostatic chuck including a plurality of independently controllable temperature zones. The process chamber also includes a laser device. The system includes a machine learning device configured to process the one or more reflected wavelengths to predict a process variable. The system compares the predicted process variable with a predetermined process variable to obtain a comparison result. The laser device is configured to direct a laser beam to the region of the substrate and change a temperature of the region of the substrate in response to the comparison result.

In an embodiment, a method for real-time compensation control of an etch process includes providing a substrate having a layer in a process chamber, performing the etch process on the layer, directing one or more wavelengths to a region of the layer by a beam conditioning assembly, receiving one or more reflected wavelengths from the region of the layer, predicting a process variable by processing the one or more reflected wavelengths using a machine learning model, and comparing the predicted process variable with a predetermined process variable to obtain a comparison result.

The foregoing outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alternatives without departing from the spirit and scope of the present disclosure.

What is claimed is:

1. An apparatus comprising:
 a beam conditioning assembly configured to output one or more wavelengths to a substrate being processed and receive one or more reflected wavelengths from the substrate, wherein the beam conditioning assembly comprises:
  an orthogonal frequency division multiplex (OFDM) device configured to provide a plurality of beams each having a different wavelength;
  a beam selector configured to select the one or more wavelengths; and
  a multiple input multiple output (MIMO) device comprising a plurality of antenna elements configured to direct the selected one or more wavelengths as a beam to scan a surface of the substrate and receive the one or more reflected wavelengths;
 a device configured to process the one or more reflected wavelengths to predict, using a machine learning model, a process variable and compare the predicted process variable with a measured process variable to obtain a comparison result; and
 a laser device configured to direct a laser beam to a region of the substrate and change a lithophotographic condition of the region of the substrate in response to the comparison result.

2. The apparatus of claim 1, wherein the laser device comprises:
 a plurality of laser beams; and
 a second multiple input multiple output (MIMO) device comprising a second plurality of antennas configured to direct the plurality of laser beams to a plurality of regions of the substrate to heat up the plurality of regions of the substrate.

3. The apparatus of claim 1, wherein the lithophotographic condition comprises a temperature.

4. The apparatus of claim 1, wherein the beam conditioning assembly and the laser device are disposed inside of a process chamber.

5. The apparatus of claim 1, wherein the machine learning model comprises an input layer, at least two hidden layers, and an output layer.

6. The apparatus of claim 1, wherein the plurality of antenna elements are arranged in an arc configuration.

7. The apparatus of claim 1, wherein the predicted process variable comprises an etched depth of a layer on the substrate, and the device is configured to create an algorithm model for a depth prediction based on the one or more reflected wavelengths.

8. The apparatus of claim 1, further comprising:
an off-axis parabolic mirror configured to direct the one or more wavelengths to the substrate and receive the one or more reflected wavelengths from the substrate.

9. A system comprising:
a process chamber for forming one or more layers on a substrate, wherein the process chamber comprises:
a beam conditioning assembly configured to output one or more wavelengths;
an off-axis parabolic mirror configured to direct the one or more wavelengths to a region of the substrate and receive one or more reflected wavelengths from the region of the substrate;
a platform configured to support the substrate, the platform comprising a plurality of independently controllable temperature zones; and
a laser device; and
a device configured to process the one or more reflected wavelengths to predict a process variable and compare the predicted process variable with a predetermined process variable to obtain a comparison result, wherein the laser device is configured to direct a laser beam to the region of the substrate and change a temperature of the region of the substrate in response to the comparison result.

10. The system of claim 9, wherein the platform further comprises a plurality of temperature sensors, at least one of the plurality of temperature sensors being associated with one of the plurality of independently controllable temperature zones.

11. The system of claim 9, wherein the platform further comprises a plurality of temperature control devices, at least one of the plurality of temperature control devices being associated with one of the plurality of independently controllable temperature zones.

12. The system of claim 11, wherein the plurality of temperature control devices each comprise a cooling element.

13. The system of claim 9, wherein the plurality of independently controllable temperature zones comprise a plurality of annular zones that extend concentrically from a center to a periphery of the substrate.

14. The system of claim 9, wherein the plurality of independently controllable temperature zones are arranged in a two-dimensional array.

15. The system of claim 9, wherein the beam conditioning assembly comprises:
an orthogonal frequency division multiplex (OFDM) device configured to provide a plurality of beams each having a different wavelength;
a beam selector configured to select the one or more wavelengths; and
a first multiple input multiple output (MIMO) device comprising a plurality of antennas configured to direct the selected one or more wavelengths as a beam to scan a surface of the substrate and receive the one or more reflected wavelengths.

16. The system of claim 9, wherein the laser device comprises:
a plurality of laser beams; and
a second multiple input multiple output (MIMO) device comprising a plurality of antennas configured to direct the plurality of laser beams to a plurality of regions of the substrate to heat up the plurality of regions of the substrate.

17. The system of claim 9, further comprising a controller configured to control the laser device based on the comparison result.

18. The system of claim 9, wherein the device is configured to train and validate an algorithm model for a depth prediction based on a phase difference between the one or more wavelengths and the one or more reflected wavelengths.

19. A semiconductor processing system comprising:
a process chamber configured to perform at least one process on a substrate, wherein the process chamber comprises:
a beam conditioning assembly configured to output one or more wavelengths;
an off-axis parabolic mirror configured to direct the one or more wavelengths to a region of the substrate and receive one or more reflected wavelengths from the region of the substrate;
a platform configured to support the substrate, the platform comprising a plurality of independently controllable temperature zones; and
a laser device configured to direct a laser beam to the region of the substrate and change a temperature of the region of the substrate; and
a device configured to process the one or more reflected wavelengths to predict, using a machine learning model, a process variable and compare the predicted process variable with a predetermined process variable to obtain a comparison result, wherein the temperature of the region is changed by the laser device in response to the comparison result.

20. The semiconductor processing system of claim 19, wherein the beam conditioning assembly comprises:
an orthogonal frequency division multiplex (OFDM) device configured to provide a plurality of beams each having a different wavelength;
a beam selector configured to select the one or more wavelengths; and
a first multiple input multiple output (MIMO) device comprising a plurality of antennas configured to direct the selected one or more wavelengths as a beam to scan a surface of the substrate and receive the one or more reflected wavelengths.

* * * * *